United States Patent
Yamauchi et al.

(10) Patent No.: US 7,642,178 B2
(45) Date of Patent: Jan. 5, 2010

(54) SEMICONDUCTOR DEVICE, METHOD FOR MANUFACTURING THE SAME AND METHOD FOR EVALUATING THE SAME

(75) Inventors: Shoichi Yamauchi, Nagoya (JP); Takumi Shibata, Tajimi (JP); Tomonori Yamaoka, Tokyo (JP); Syouji Nogami, Tokyo (JP)

(73) Assignees: DENSO CORPORATION, Kariya (JP); Sumco Corporation, Tokyo (JP)

( * ) Notice: Subject to any disclaimer, the term of this patent is extended or adjusted under 35 U.S.C. 154(b) by 399 days.

(21) Appl. No.: 11/526,879

(22) Filed: Sep. 26, 2006

(65) Prior Publication Data

US 2007/0072397 A1    Mar. 29, 2007

(30) Foreign Application Priority Data

Sep. 29, 2005    (JP)    ............... 2005-285697

(51) Int. Cl.
    *H01L 21/00*    (2006.01)
(52) U.S. Cl. .............. 438/505; 438/172; 438/478; 438/503; 257/49; 257/51
(58) Field of Classification Search .......... 257/136, 257/327, 330, 341, 491, 493, 623, 627, 655, 257/49, 51; 438/172, 268, 269, 478, 524, 438/597, 680, 689, 505, 503
See application file for complete search history.

(56) References Cited

U.S. PATENT DOCUMENTS

| | | | |
|---|---|---|---|
| 6,495,294 B1 | 12/2002 | Yamauchi et al. | |
| 6,498,368 B2 * | 12/2002 | Sakamoto et al. | ........... 257/341 |
| 7,029,977 B2 | 4/2006 | Kishimoto et al. | |
| 2003/0224588 A1 | 12/2003 | Yamauchi et al. | |
| 2004/0016959 A1 | 1/2004 | Yamauchi et al. | |
| 2004/0185665 A1 * | 9/2004 | Kishimoto et al. | .......... 438/689 |
| 2005/0035401 A1 | 2/2005 | Yamauchi et al. | |
| 2005/0221547 A1 | 10/2005 | Yamauchi et al. | |

OTHER PUBLICATIONS (Quirk, Semiconductor Manufacturing Technology, 2001, pp. 171-172, 'Secondary-Ion Mass Spectrometry (SIMS)').*

Office Action dated Apr. 7, 2008 in corresponding German Patent Application No. 10 2006 045 914.8-33 (and English translation).

* cited by examiner

*Primary Examiner*—Thanh V Pham
*Assistant Examiner*—Errol Fernandes
(74) *Attorney, Agent, or Firm*—Posz Law Group, PLC

(57) ABSTRACT

A method for manufacturing a semiconductor device includes steps of: forming a first epitaxial film on a silicon substrate; forming a trench in the first epitaxial film; and forming a second epitaxial film on the first epitaxial film and in the trench. The step of forming the second epitaxial film includes a final step, in which a mixed gas of a silicon source gas and a halide gas is used. The silicon substrate has an arsenic concentration defined as $\alpha$. The second epitaxial film has an impurity concentration defined as $\beta$. The arsenic concentration and the impurity concentration has a relationship of: $\alpha \leq 3 \times 10^{19} \times \ln(\beta) - 1 \times 10^{21}$.

7 Claims, 17 Drawing Sheets

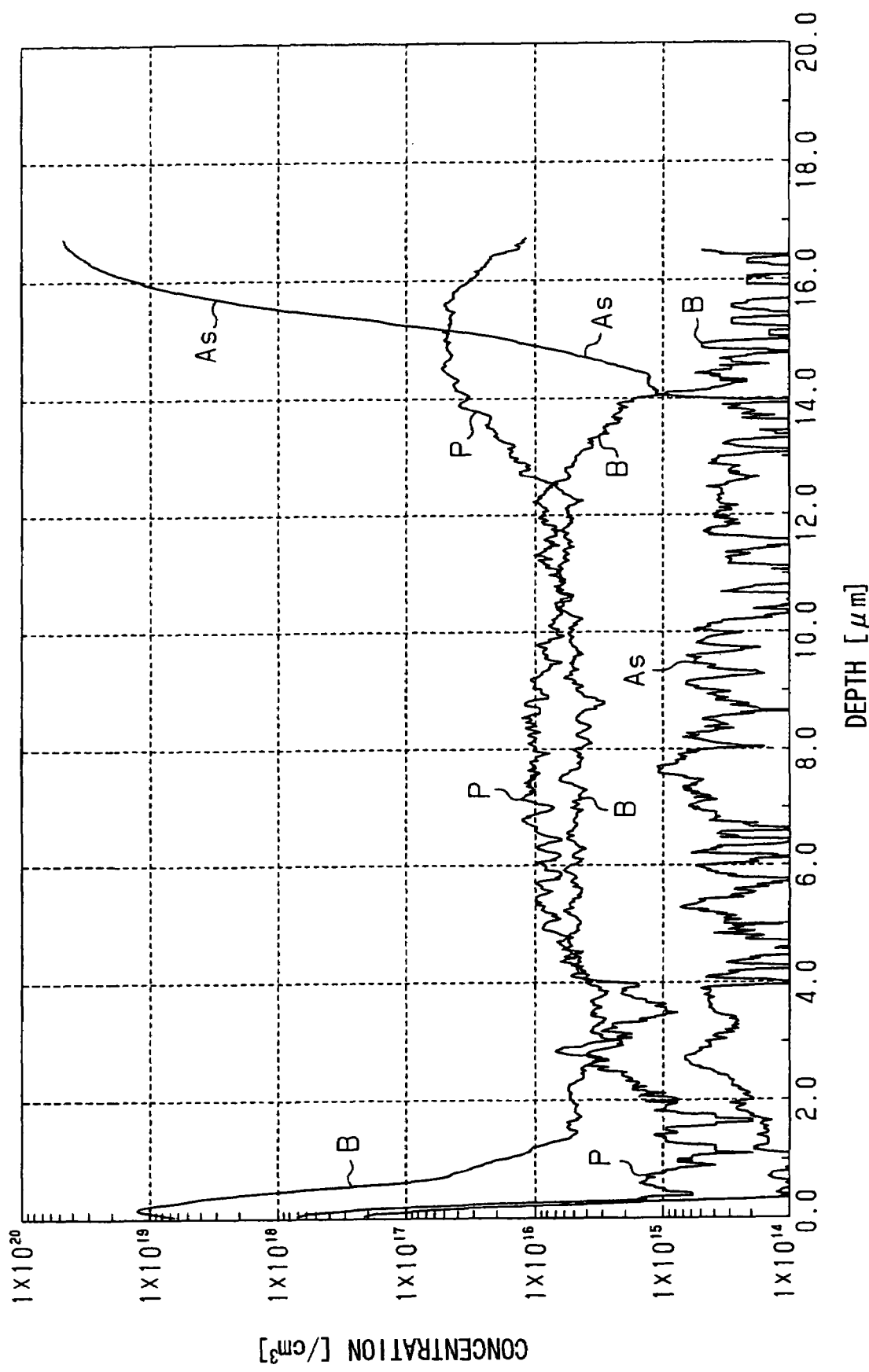

SEMICONDUCTOR DEVICE, METHOD FOR MANUFACTURING THE SAME AND METHOD FOR EVALUATING THE SAME

CROSS REFERENCE TO RELATED APPLICATION

This application is based on Japanese Patent Application No. 2005-285697 filed on Sep. 29, 2005, the disclosure of which is incorporated herein by reference.

FIELD OF THE INVENTION

The present invention relates to a semiconductor device, a method for manufacturing a semiconductor device, and a method for evaluating a semiconductor device.

BACKGROUND OF THE INVENTION

There has been proposed a technique wherein, in forming a p/n column structure by trench filling epitaxial growth, a mixed growth scheme based on an etching gas and silane gas is employed, thereby to prevent the open part of a trench from being closed earlier (refer to U.S. Pat. No. 7,029,977-B2).

Due to the mixing of the etching gas, however, the etching reaction of an n⁺-type silicon substrate occurs to give rise to the phenomenon that, as shown in FIG. 24, a high-concentration dopant (As, Sb or P) within the etched n⁺ substrate adheres onto the front surface of this substrate so as to be accepted into a p/n column layer. Meanwhile, a super junction MOS (SJ-MOS) overcomes the trade-off relation of an ON-state resistance and a breakdown voltage by full depletion within a p/n column. It is required for the full depletion to balance the charge quantities of p/n column elements, and the mixing of the dopant from the n⁺ substrate is a fatal problem in a concentration design.

Further, a technique which is intended to perform trench filling by employing the etching action of an etching gas is disclosed in U.S. Pat. No. 6,495,294. Here, a trench shape tapered and worked by employing the etching action of the etching gas. Also in this case, a high-concentration dopant similarly adheres onto the front surface of an n⁺-type substrate (onto an epitaxial film of the opposite conductivity type within a trench) due to the etching reaction of the substrate.

Thus, it is required that a desired carrier distribution can be attained in a semiconductor substrate wherein trenches are formed in an epitaxial film on a silicon substrate and wherein other epitaxial films opposite in conductivity type to the first-mentioned epitaxial film are filled in the trenches.

SUMMARY OF THE INVENTION

In view of the above-described problem, it is an object of the present disclosure to provide a semiconductor device. It is another object of the present disclosure to provide a method for manufacturing a semiconductor device. It is further another object of the present disclosure to provide a method for evaluating a semiconductor device.

According to a first aspect of the present disclosure, a method for manufacturing a semiconductor device includes steps of: forming a first epitaxial film having a first conductive type on a silicon substrate having the first conductive type, wherein the first epitaxial film has an impurity concentration lower than that of the silicon substrate; forming a trench in the first epitaxial film; and forming a second epitaxial film having a second conductive type on the first epitaxial film and in the trench so that the trench is filled with the second epitaxial film. The step of forming the second epitaxial film includes a final step, in which a mixed gas of a silicon source gas and a halide gas is used for forming the second epitaxial film. The silicon substrate has an arsenic concentration as the impurity concentration therein, which is defined as $\alpha$. The second epitaxial film has an impurity concentration, which is defined as $\beta$. The arsenic concentration in the silicon substrate and the impurity concentration in the second epitaxial film has a relationship of: $\alpha \leq 3 \times 10^{19} \times \ln(\beta) - 1 \times 10^{21}$.

In the above method, when the trench is filled with the second epitaxial film, an amount of arcencium to be introduced into the second epitaxila film is reduced. Thus, a carrier concentration distribution in the device is appropriately obtained.

According to a second aspect of the present disclosure, a method for manufacturing a semiconductor device includes steps of: forming a first epitaxial film having a first conductive type on a silicon substrate having the first conductive type, wherein the first epitaxial film has an impurity concentration lower than that of the silicon substrate; forming a trench in the first epitaxial film; forming a second epitaxial film having a second conductive type on the first epitaxial film and in the trench; and etching a part of the second epitaxial film and forming the second epitaxial film on the first epitaxial film and in the trench so that the trench is filled with the second epitaxial film. The silicon substrate has an arsenic concentration as the impurity concentration therein, which is defined as $\alpha$. The second epitaxial film has an impurity concentration, which is defined as $\beta$. The arsenic concentration in the silicon substrate and the impurity concentration in the second epitaxial film has a relationship of: $\alpha \leq 3 \times 10^{19} \times \ln(\beta) - 1 \times 10^{21}$.

In the above method, since the part of the second epitaxial film is etched, and then, the second epitaxial film is formed on the first epitaxial film and in the trench, an amount of arcencium to be introduced into the second epitaxila film is reduced. Thus, a carrier concentration distribution in the device is appropriately obtained.

According to a third aspect of the present disclosure, a semiconductor device includes: a silicon substrate having a first conductive type; a first epitaxial film having the first conductive type on the silicon substrate, wherein the first epitaxial film has an impurity concentration lower than that of the silicon substrate; a plurality of trenches in the first epitaxial film; and a second epitaxial film having a second conductive type in each trench. The first epitaxial film between two adjacent trenches provides a first impurity region. The second epitaxial film in the trench provides a second impurity region. The first impurity region and the second impurity region are alternately arranged along with a predetermined direction parallel to the silicon substrate so that a super junction structure is provided. The silicon substrate has an arsenic concentration as the impurity concentration therein, which is defined as $\alpha$. The second epitaxial film has an impurity concentration, which is defined as $\beta$. The arsenic concentration in the silicon substrate and the impurity concentration in the second epitaxial film has a relationship of: $\alpha \leq 3 \times 10^{19} \times \ln(\beta) - 1 \times 10^{21}$.

The above device has an excellent carrier concentration distribution.

According to a fourth aspect of the present disclosure, a method for evaluating a semiconductor device is provided. The device includes: a silicon substrate having a first conductive type; a first epitaxial film having the first conductive type on the silicon substrate, wherein the first epitaxial film has an impurity concentration lower than that of the silicon substrate; a plurality of trenches in the first epitaxial film; and a second epitaxial film having a second conductive type in each trench, wherein the first epitaxial film between two adjacent trenches provides a first impurity region, the second epitaxial film in the trench provides a second impurity region, and the first impurity region and the second impurity region are alternately arranged along with a predetermined direction parallel to the silicon substrate so that a super junction structure is provided. The method includes steps of: irradiating a primary ion on a surface of a predetermined region of the super junction structure so that the surface of the predetermine region is etched in a depth direction perpendicular to the silicon substrate, wherein the predetermined region of the super junction structure includes a plurality of first impurity regions and second impurity regions; mass-analyzing a secondary ion, which is discharged from the surface of the predetermine region; measuring an average concentration of a dopant in the first impurity regions along with the depth direction; measuring an average concentration of a dopant in the second impurity regions along with the depth direction; measuring an average concentration of a dopant in the silicon substrate along with the depth direction; and determining a carrier concentration distribution of the super junction structure on the basis of the average concentration in each of the first impurity regions, the second impurity regions and the silicon substrate.

In the above method, the carrier concentration distribution of the super junction structure is appropriately evaluated in view of influence of a shape, a crystal orientation, a depth profile and the like.

According to a fifth aspect of the present disclosure, a method for evaluating a semiconductor device is provided. The device includes: a silicon substrate having a first conductive type; a plurality of trenches in the silicon substrate; and an epitaxial film having a second conductive type in each trench, wherein the silicon substrate between two adjacent trenches provides a first impurity region, the epitaxial film in the trench provides a second impurity region, and the first impurity region and the second impurity region are alternately arranged along with a predetermined direction parallel to the silicon substrate so that a super junction structure is provided. The method includes steps of: irradiating a primary ion on a surface of a predetermined region of the super junction structure so that the surface of the predetermine region is etched in a depth direction perpendicular to the silicon substrate, wherein the predetermined region of the super junction structure includes a plurality of first impurity regions and second impurity regions; mass-analyzing a secondary ion, which is discharged from the surface of the predetermine region; measuring an average concentration of a dopant in the first impurity regions along with the depth direction; measuring an average concentration of a dopant in the second impurity regions along with the depth direction; and determining a carrier concentration distribution of the super junction structure on the basis of the average concentration in each of the first impurity regions and the second impurity regions.

In the above method, the carrier concentration distribution of the super junction structure is appropriately evaluated in view of influence of a shape, a crystal orientation, a depth profile and the like.

BRIEF DESCRIPTION OF THE DRAWINGS

The above and other objects, features and advantages of the present invention will become more apparent from the following detailed description made with reference to the accompanying drawings. In the drawings:

FIG. 12 is a graph showing a result of mass analysis;

DETAILED DESCRIPTION OF THE PREFERRED EMBODIMENTS

First Embodiment

Now, a first embodiment will be described in conjunction with the drawings.

Figure 1:
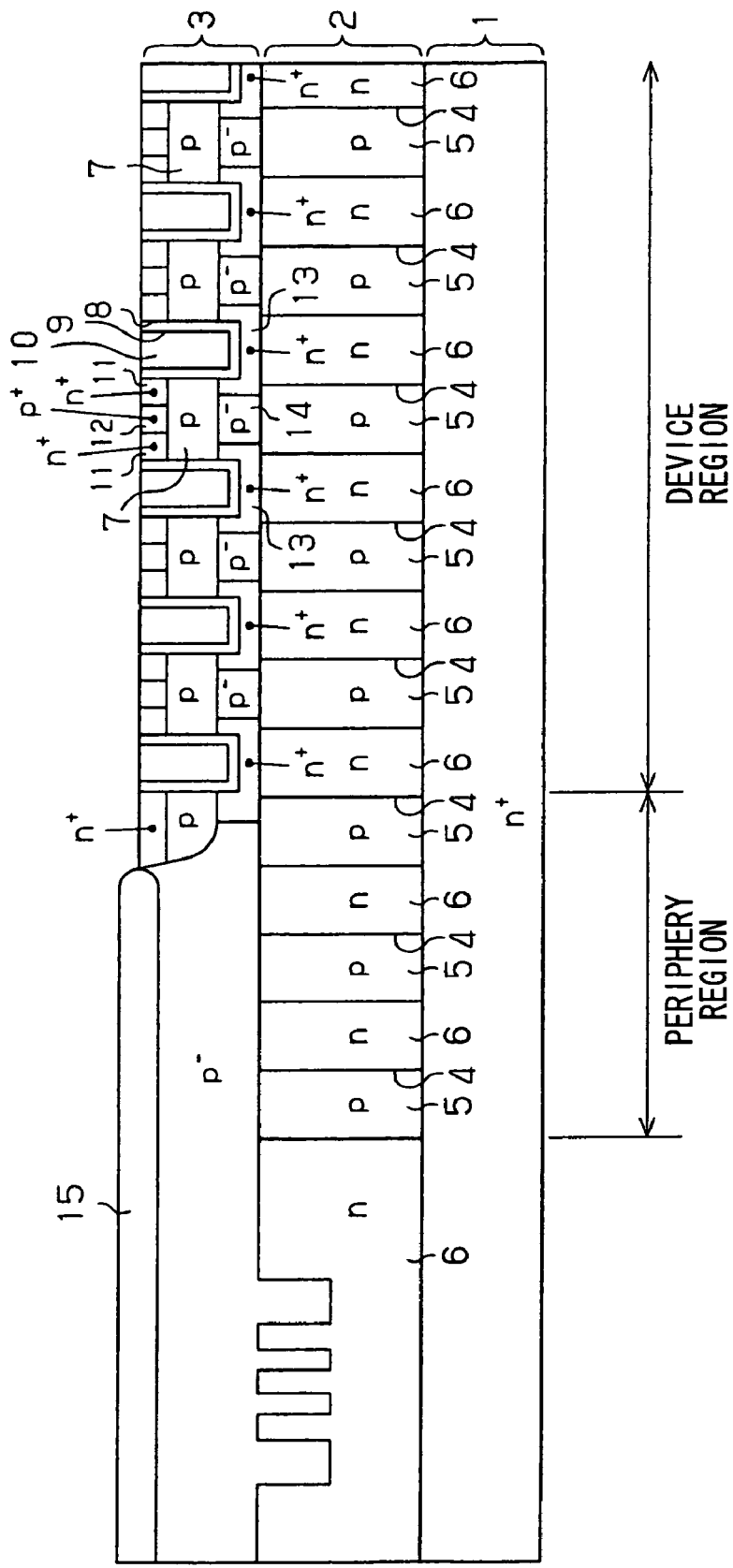
FIG. 1 is a cross sectional view showing a vertical trench gate type MOSFET.
Figure 2:
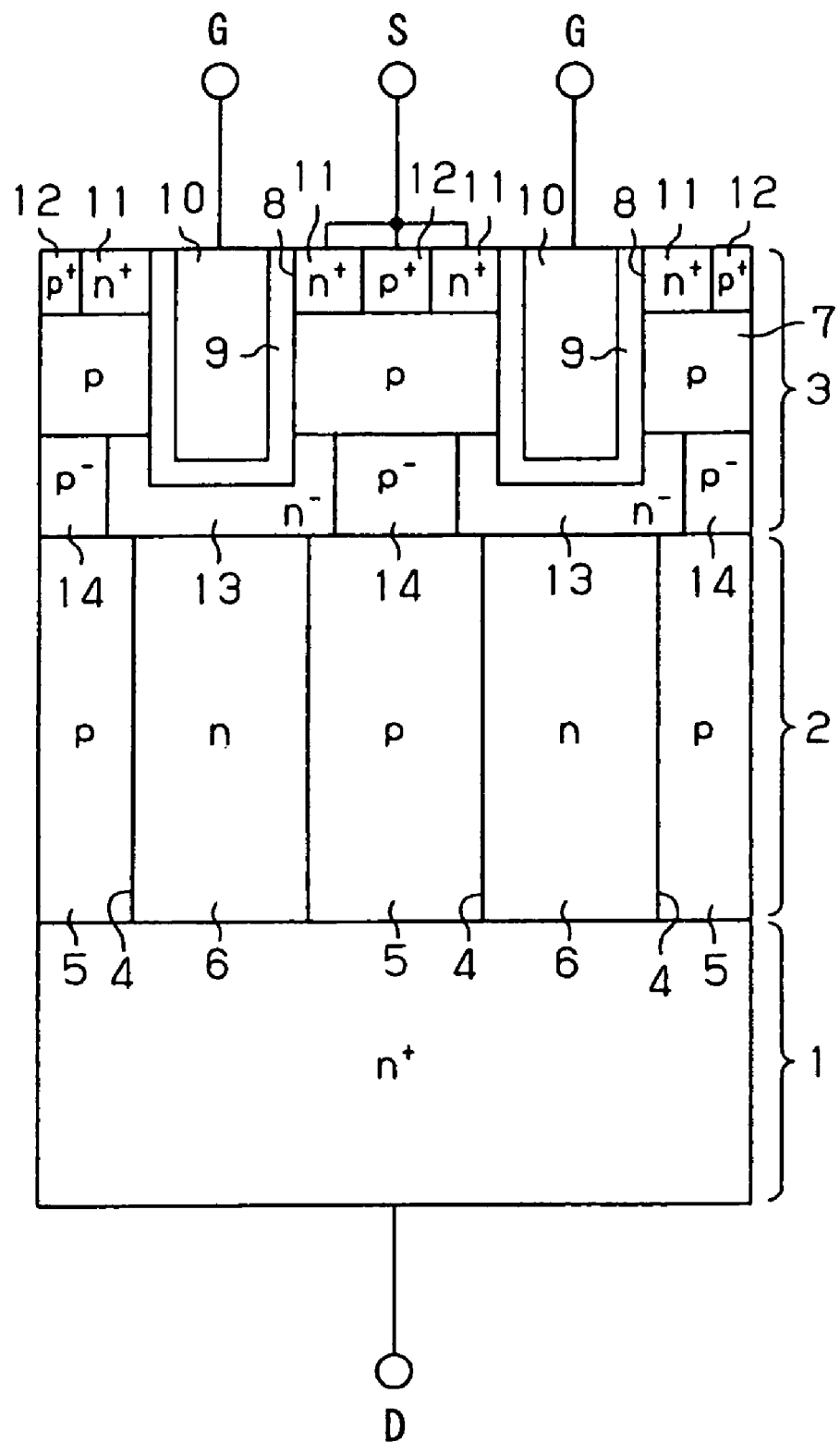
FIG. 2 is a partially enlarged cross sectional view showing the MOSFET in FIG. 1.

Shown in FIG. 1 is a sectional view of a vertical trench gate MOSFET (a vertical super junction MOS device) in this embodiment. FIG. 2 is an enlarged view of essential parts in an element portion in FIG. 1.

Referring to FIG. 2, an n-type epitaxial film 2 is formed on an $n^+$ silicon substrate 1 serving as a drain region, and an epitaxial film 3 is formed on the epitaxial film 2. Trenches 4 are arranged in the lower epitaxial film 2, and these trenches 4 penetrate through the epitaxial film 2 to reach the $n^+$ silicon substrate 1. Epitaxial films 5 are respectively filled in the trenches 4. The conductivity type of the epitaxial films 5 in the trenches 4 is p type, and the conductivity type of regions 6 located laterally of the trenches 4 is n type. In this manner, the p-type regions (5) and the n-type regions 6 are alternately arranged in the lateral direction, thereby to construct a so-called "super junction structure" in which the drift layer of the MOSFET is of p/n column structure. More specifically, this embodiment has the super junction structure in which the n-type regions (impurity diffusion regions of the first conductivity type) 6 extending in a depthwise direction and the p-type regions (impurity diffusion regions (5) of the second conductivity type) similarly extending in the depthwise direction are arranged in large numbers in a state where they are adjacent to one another in a planar direction.

In the upper epitaxial film 3, p well layers 7 are formed in the surface layer parts of this epitaxial film. Trenches 8 for gates are arranged in the epitaxial film 3, and these trenches 8 are formed to be deeper than the p well layers 7. Gate oxide films 9 are formed on the inner surfaces of the trenches 8, and poly-silicon gate electrodes 10 are arranged inside the gate oxide films 9. Here, $n^+$ source regions 11 are formed in those surface layer parts of the upper surface of the epitaxial film 3 which lie in touch with the trenches 8. Besides, $p^+$ source contact regions 12 are formed in the surface layer parts of the upper surface of the p-type epitaxial film 3. Further, $n^-$ buffer regions 13 are formed for the respective trenches 8, between the p well layers 7 in the epitaxial film 3 and the epitaxial film 2 (drift layer). The $n^-$ buffer regions 13 include the bottom surface parts of the trenches 8, and they lie in touch with the n-type regions 6 in the drift layer and p well layers 7. In addition, the interspace between the $n^-$ buffer regions 13 for the respective trenches 8 are formed as $p^-$ regions 14.

A drain electrode (not shown) is formed on the lower surface of the $n^+$ silicon substrate 1, and the drain electrode is electrically connected with the $n^+$ silicon substrate 1. Besides, a source electrode (not shown) is formed on the upper surface of the epitaxial film 3, and the source electrode is electrically connected with the $n^+$ source regions 11 and the $p^+$ source contact region 12.

Here, in a state where a source voltage is set at a ground potential and where a drain voltage is set at a positive potential, a predetermined positive voltage is applied as a gate potential, whereby the transistor turns ON. In the transistor-ON mode, inversion layers are formed in those parts of the p well layer 7 which lie in touch with the gate oxide films 9, and electrons flow between the source and the drain through the inversion layers (from the $n^+$ source regions 11, the p well layer 7, the $n^-$ buffer regions 13, the n-type regions 6, to the $n^+$ silicon substrate 1). Besides, when a reverse bias is applied (in a state where the source voltage is set at the ground potential and where the drain voltage is set at the positive potential), depletion layers are spread from the p-n junctions between the p-type region (5) and the n-type regions 6, the p-n junctions between the $n^-$ buffer regions 13 and the $p^-$ region 14, and the p-n junctions between the $n^-$ buffer regions 13 and the p well layer 7, and the p-type region (5) and the n-type regions 6 are depleted, so that the breakdown voltage of the transistor is heightened.

Meanwhile, referring to FIG. 1, also in a terminal portion around the element portion, n-type regions 6 and p-type regions (5) are alternately arranged in the lateral direction. Besides, a LOCOS oxide film 15 is formed on the outer peripheral side of the upper surface of the epitaxial film 3 with respect to the element portion.

Next, there will be described a method of manufacturing a vertical trench gate MOSFET in this embodiment.

Figure 3A:
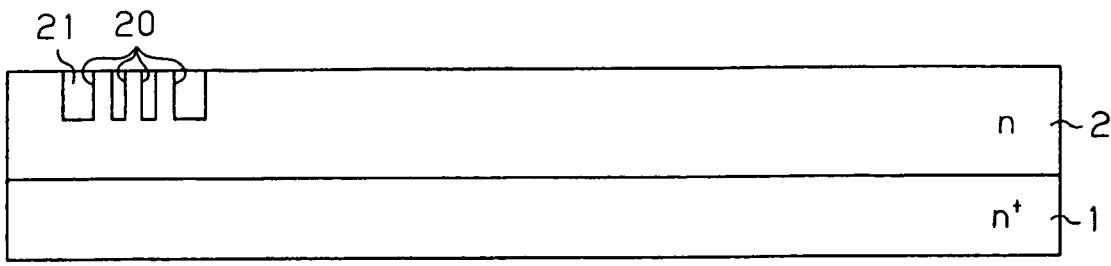
FIGS. 3A to 3D are cross sectional views explaining a method for manufacturing the MOSFET in FIG. 1.

First, as shown in FIG. 3A, an $n^+$ silicon substrate 1 is prepared. The $n^+$ silicon substrate 1 employs As (arsenic) as an impurity. Besides, an epitaxial film 2 of n-type is formed on the $n^+$ silicon substrate 1. Further, a plurality of trenches 20 are formed in the epitaxial film 2 at the outer peripheral part of a chip, and the trenches 20 are filled with silicon oxide films 21. Besides, the upper surface of the epitaxial film 2 is flattened.

Figure 3B:

Subsequently, as shown in FIG. 3B, a silicon oxide film 22 is formed on the n-type epitaxial film 2, and the silicon oxide film 22 is patterned into a predetermined shape so as to obtain predetermined trenches. Besides, using the silicon oxide film 22 as a mask, the n-type epitaxial film 2 is subjected to anisotropic etching (RIE) or to wet etching with an alkaline anisotropic etchant (KOH, TMAH or the like), thereby to form the trenches 4 which reach the silicon substrate 1.

Figure 3C:
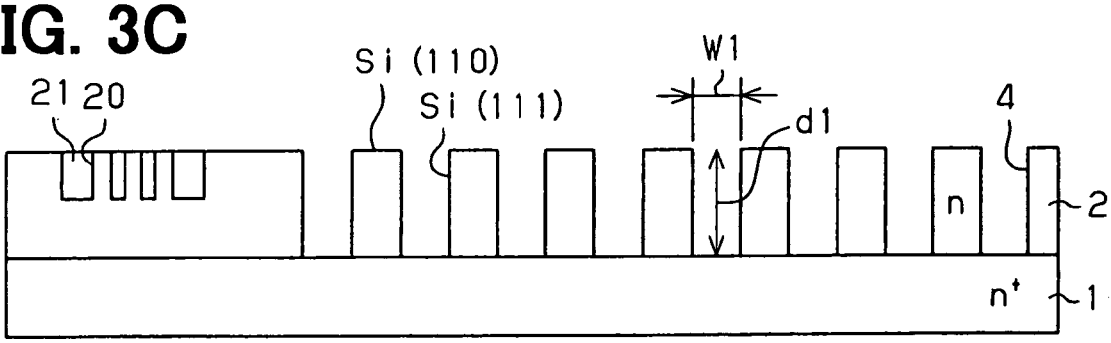

Further, as shown in FIG. 3C, the silicon oxide film 22 used as the mask is removed. On this occasion, an Si(110) substrate is employed, and the upper surface of the epitaxial film 2 has a (110) face, while the side surface of each trench 4 is made a (111) face. That is, the bottom surface of each trench is made the (110) face, and the side surface thereof is made the (111) face. Alternatively, an Si-(100) substrate is employed, and the upper surface of the epitaxial film 2 is made a (100) face, while the side surface of each trench 4 is made the (100) face. That is, the bottom surface of each trench is made the (100) face, and the side surface thereof is also made the (100) face.

Figure 3D:
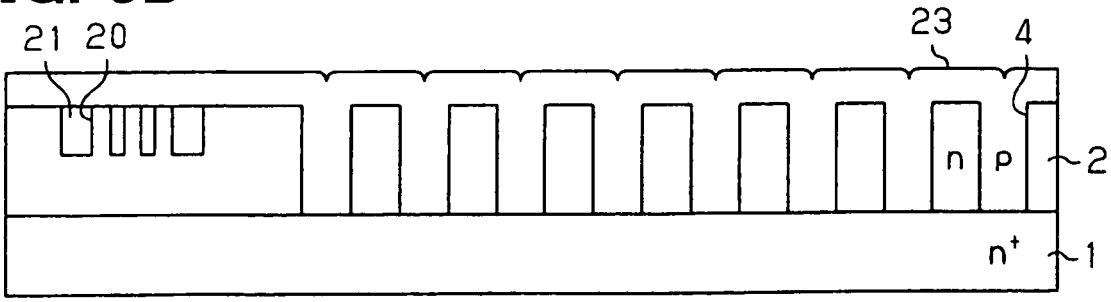

Besides, the resulting structure is subjected to hydrogen annealing in a hydrogen atmosphere. Thereafter, as shown in FIG. 3D, a p-type epitaxial film 23 is formed on the epitaxial film 2 including the inner surfaces of the trenches 4, whereby the trenches 4 are filled with the epitaxial film 23. At the step of filling the trenches 4 with the epitaxial film 23, a mixed gas which consists of a silicon source gas and a halide gas is employed as a gas which is supplied to the silicon substrate in order to form the epitaxial film 23. Concretely, any of monosilane ($SiH_4$), disilane ($Si_2H_6$), dichlorosilane ($SiH_2Cl_2$), trichlorosilane ($SiHCl_3$) and silicon tetrachloride ($SiCl_4$) is employed as the silicon source gas. Especially, any of dichlorosilane ($SiH_2Cl_2$), trichlorosilane ($SiHCl_3$) and silicon tetrachloride ($SiCl_4$) should preferably be employed as the silicon source gas. Any of hydrogen chloride (HCl), chlorine ($Cl_2$), fluorine ($F_2$), chlorine trifluoride ($ClF_3$), hydrogen fluoride (HF) and hydrogen bromide (HBr) is employed as the halide gas.

In addition, the epitaxial film 23 is formed under the condition of a rate determining reaction. Especially in case of employing monosilane or disilane as the silicon source gas, the upper limit of a film formation temperature is set at 950° C. In case of employing dichlorosilane as the silicon source gas, the upper limit of a film formation temperature is set at 1100° C. In case of employing trichlorosilane as the silicon source gas, the upper limit of a film formation temperature is set at 1150° C. In case of employing silicon tetrachloride as the silicon source gas, the upper limit of a film formation temperature is set at 1200° C. Besides, in a case where a film-formation vacuum degree is within a range of a normal pressure to 100 Pa, the lower limit of a film formation temperature is set at 800° C., and in a case where a film-formation vacuum degree is within a range of 100 Pa to $1 \times 10^{-5}$ Pa, the lower limit of a film formation temperature is set at 600° C. It has been experimentally verified that, in this way, epitaxial growth can be performed without the appearance of crystal defects.

Figure 4A:
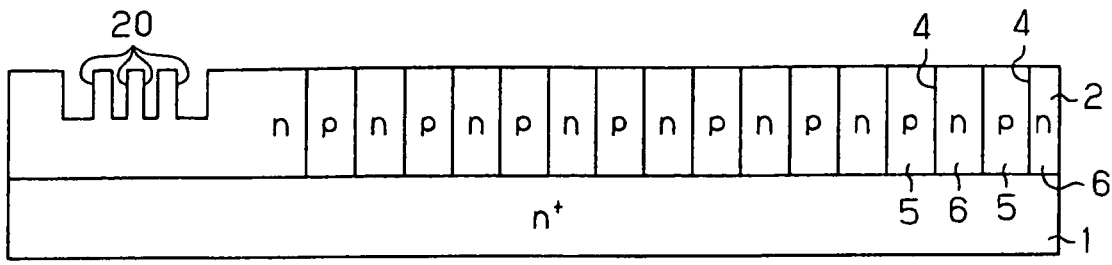
FIGS. 4A to 4D are cross sectional views explaining the method for manufacturing the MOSFET in FIG. 1.

Thereafter, the resulting structure is subjected to flattening polishing from the upper surface side of the epitaxial film 23, thereby to expose the epitaxial film (n-type silicon layer) 2 as shown in FIG. 4A. Thus, p-type regions (5) and n-type regions 6 are alternately arranged in a lateral direction.

Besides, the silicon oxide films 21 (refer to FIG. 3D) within the trenches 20 at the outer peripheral part of the chip are removed.

Figure 4B:
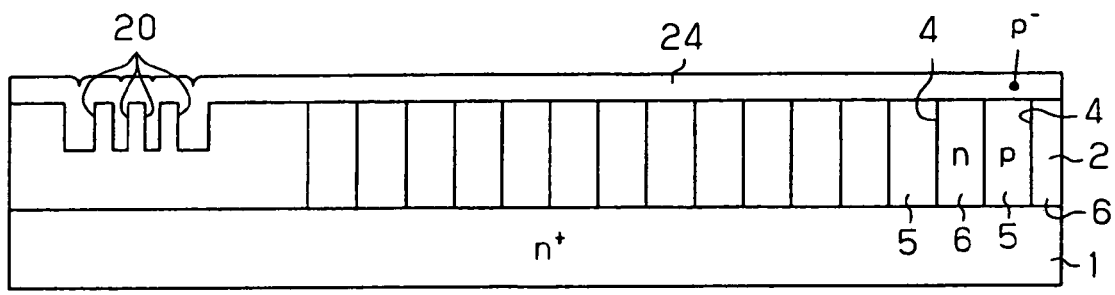
Figure 4C:
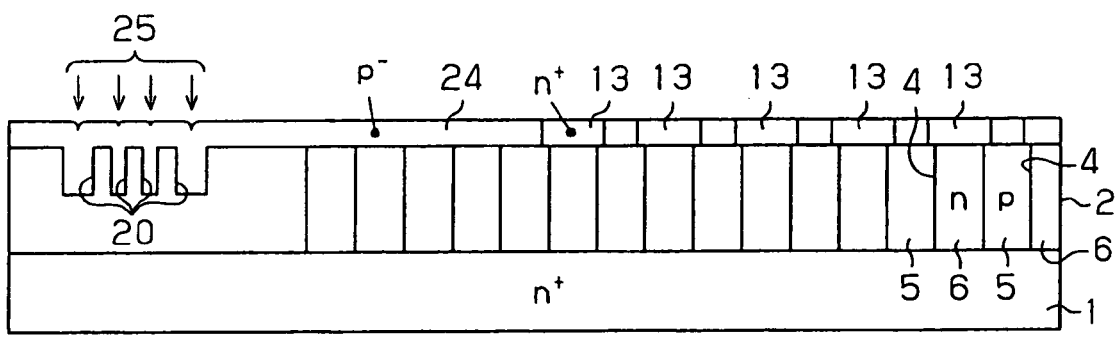

Besides, as shown in FIG. 4B, a p⁻-type epitaxial film 24 is formed on the epitaxial film 2. Further, as shown in FIG. 4C, n⁻ buffer regions 13 are formed on those parts of the p⁻-type epitaxial film 24 which lie in touch with the n-type regions 6, by ion implantation. On this occasion, dents (i.e., concavity) 25 are formed in the upper surface of the epitaxial film 24 in the trenches 20 provided at the outer peripheral part of the chip, and the structure to-be-ion-implanted is positioned to a photo-mask by using the dents 25 as alignment marks.

Figure 4D:
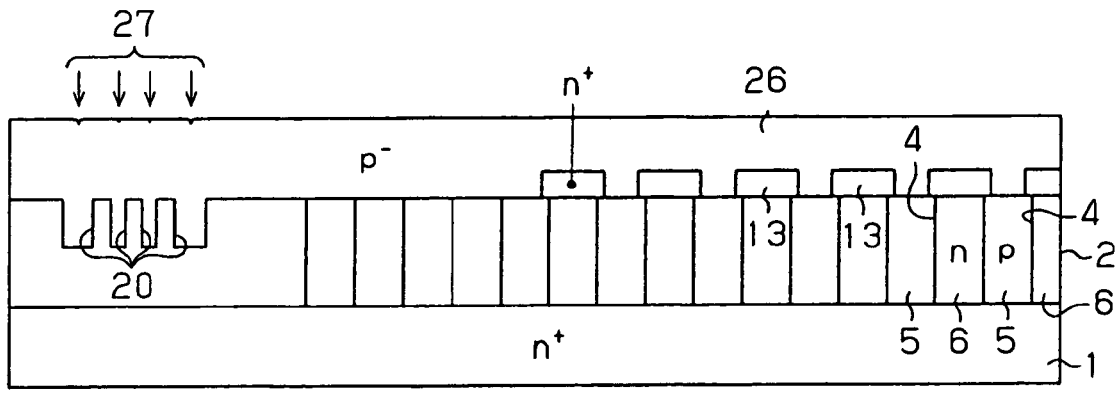

Subsequently, as shown in FIG. 4D, a p⁻-type epitaxial film 26 is formed on the p⁻-type epitaxial film 24.

Thereafter, a LOCOS oxide film 15 is formed as shown in FIG. 1. Besides, p well layers 7, trenches 8, gate oxide films 9, poly-silicon gate electrodes 10, n⁺ source regions 11 and p⁺ source contact regions 12 are formed in an element portion. Further, electrodes and wiring lines are formed. In the formation of the element portion, in a case where the n⁺ source regions 11, the p⁺ source contact regions 12 or the likes are formed by ion implantation, dents 27 are formed in the upper surface of the epitaxial film 26 in the trenches 20 provided at the outer peripheral part of the chip, as shown in FIG. 4D, and the structure to-be-ion-implanted is positioned to a photomask by using the dents 27 as alignment marks.

Incidentally, at that stage after the formation of the trenches 4 in the n-type epitaxial film 2 which extends from the start of the formation of the epitaxial film 23 until the trenches 4 are filled with the epitaxial film 23, a mixed gas which consists of a silicon source gas and a halide gas has been employed as a gas which is supplied to the silicon substrate (1, 2) in order to form the epitaxial film 23. In a broad sense, however, the mixed gas which consists of the silicon source gas and the halide gas may be employed as the gas which is supplied to the silicon substrate (1, 2) in order to form the epitaxial film 23, at least at the final filling step in the case where the trenches 4 are filled with the p-type epitaxial film 23.

On this occasion, as the film formation condition of the epitaxial film 23 and regarding the epitaxial film 23 which is grown on the side surfaces of the trenches, a growth rate at the open parts of the trenches is made lower than a growth rate at parts deeper than the open parts of the trenches, by introducing the halide gas. In this way, the epitaxial film to be grown within the trenches are formed under the condition that a film thickness at the open parts of the trenches becomes smaller than a film thickness at the bottom parts of the trenches. Thus, regarding the epitaxial film on the side surfaces of the trenches, the film thickness becomes smaller at the open parts of the trenches than at the bottom parts thereof, and the closure of the open parts of the trenches by the epitaxial film is suppressed, so that the fillability of the trenches can be enhanced (voidless film formation becomes possible). That is, owing to the voidless film formation, it is permitted to ensure a breakdown voltage and suppress a junction leakage current when the reverse bias is applied to the super junction structure (p/n column structure) (or when a source is set at the ground potential, and a drain potential is set at a positive voltage). It is also possible to attain voidless implementation (reduction in a void size), enhancement in a yield concerning the breakdown voltage, and enhancement in a yield concerning the junction leakage current.

Especially, in forming the epitaxial film 23 in FIG. 3D, conditions as stated below are set in accordance with the aspect ratio of each trench.

In a case where the aspect ratio of the trench is less than 10, and where the standard flow rate of the halide gas is X [slm], while the growth rate is Y [μm /min], the next relationship is obtained.

$$Y<0.2X+0.1 \tag{F1}$$

In a case where the aspect ratio of the trench is at least 10 and less than 20, and where the standard flow rate of the halide gas is X [slm], while the growth rate is Y [μm /min], the next relationship is obtained.

$$Y<0.2X+0.05 \tag{F2}$$

In a case where the aspect ratio of the trench is at least 20, and where the standard flow rate of the halide gas is X [slm], while the growth rate is Y [μm/min], the next relationship is obtained.

$$Y<0.2X \tag{F3}$$

These conditions are favorable from the viewpoint of efficiently filling the trenches with the epitaxial film while the appearance of voids is suppressed.

Figure 5:
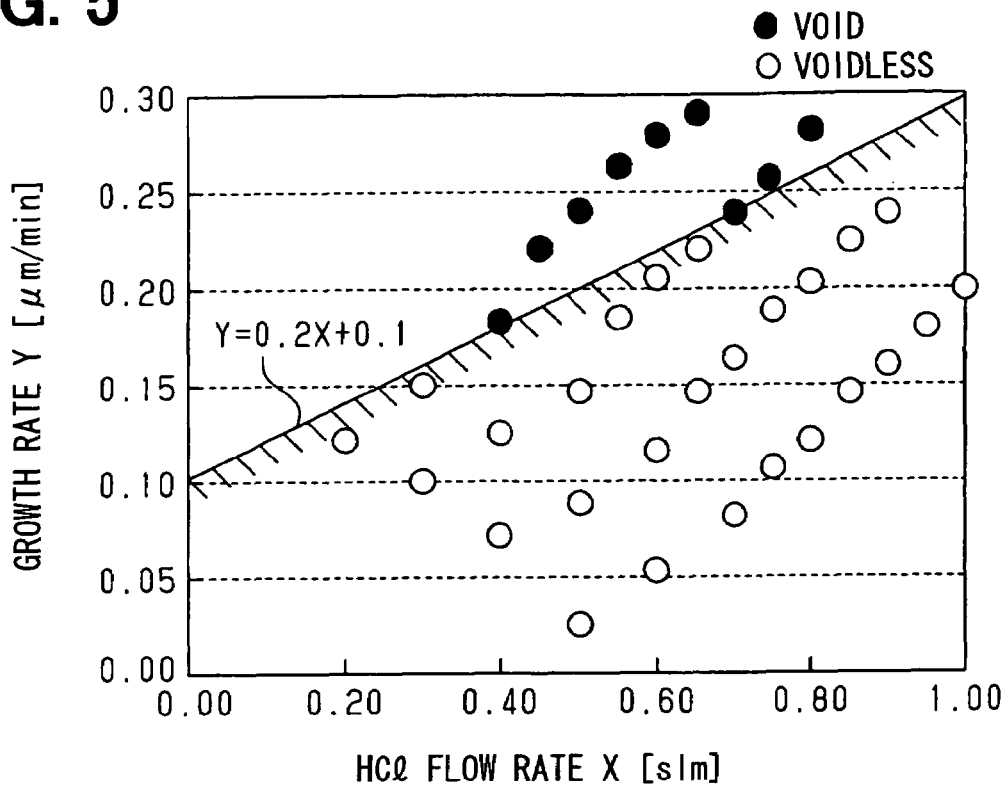
FIG. 5 is a graph showing a relationship between a standard flow rate of HCl and a growth rate of an epitaxial film.
Figure 6:
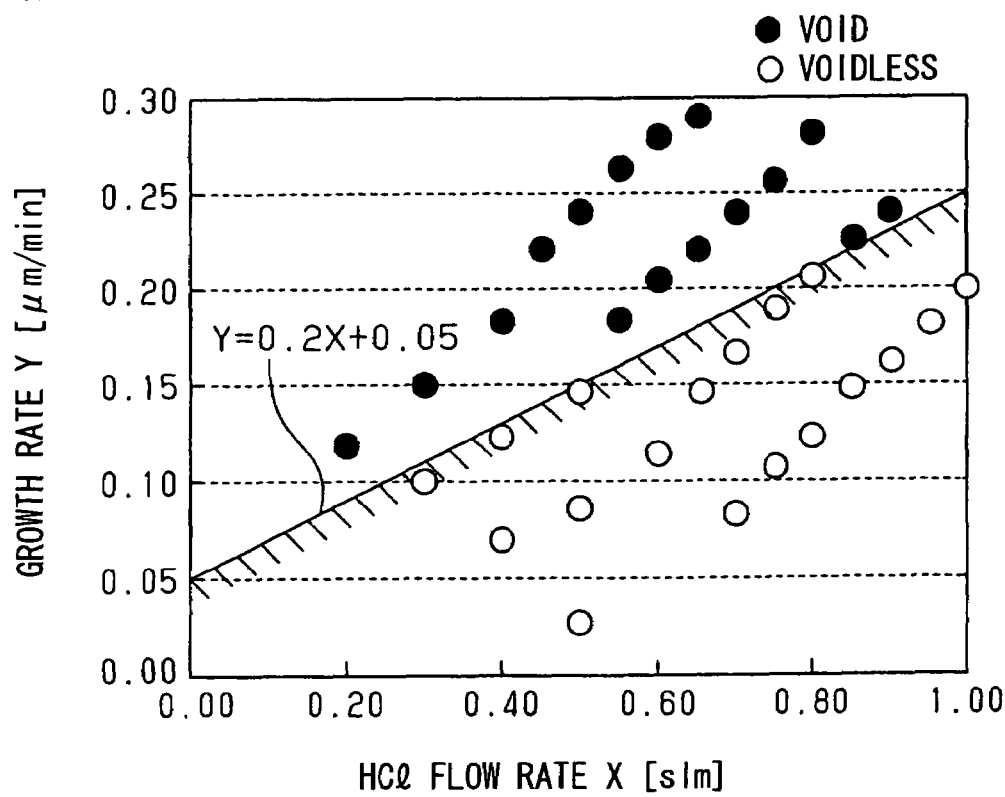
FIG. 6 is a graph showing a relationship between a standard flow rate of HCl and a growth rate of an epitaxial film.
Figure 7:
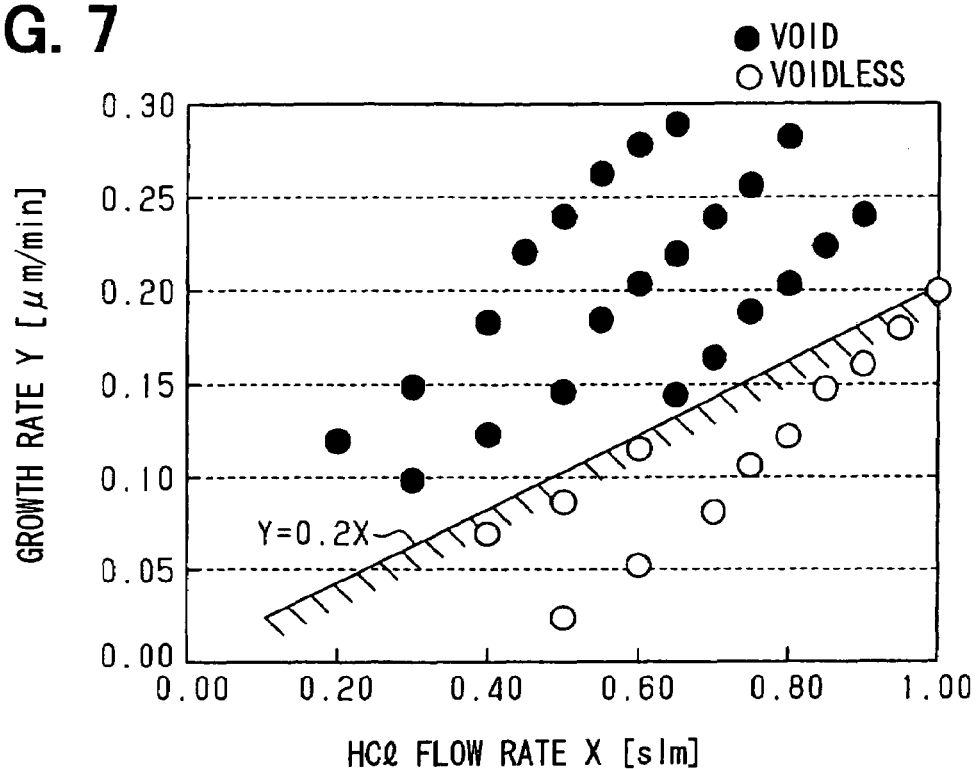
FIG. 7 is a graph showing a relationship between a standard flow rate of HCl and a growth rate of an epitaxial film.

Experimental results on which the conditions are grounded are shown in FIGS. 5, 6 and 7. In each of FIGS. 5, 6 and 7, the standard flow rate X [slm] of hydrogen chloride is taken on the axis of abscissas, and the growth rate Y [μm/min] is taken on the axis of ordinates. FIG. 5 corresponds to a case where the aspect ratio is "5", FIG. 6 corresponds to a case where the aspect ratio is "15", and FIG. 7 corresponds to a case where the aspect ratio is "25". In each of FIGS. 5, 6 and 7, a black dot indicates that voids existed, whereas a white dot indicates that voids did not exist. It is seen from each figure that, when the standard flow rate of hydrogen chloride is large, the voids do not appear in spite of the high growth rate of the epitaxial film. It is also seen that, at the same standard flow rate of hydrogen chloride, the appearance of the voids cannot be prevented unless the growth rate of the epitaxial film is made lower with the larger aspect ratio. A formula which represents the boundary of the existence or nonexistence of the voids in each figure is Y=0.2 X+0.1 in FIG. 5, Y=0.2 X+0.05 in FIG. 6, and Y=0.2 X in FIG. 7, and the voids do not appear in a region under each formula. Incidentally, the "aspect ratio of the trench" is d1/W1 as indicated in FIG. 3C, that is, the (depth of the trench)/the (width of the trench).

Figure 24:
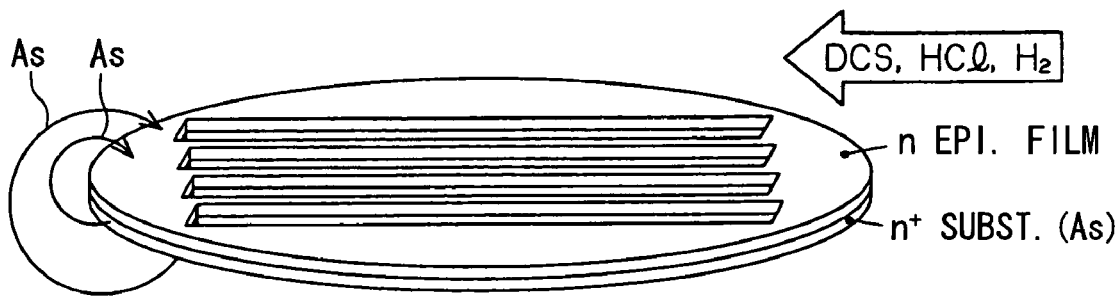
FIG. 24 is a perspective view explaining a movement of As atom in a step of forming a filled epitaxial film in a trench.

Next, it will be described that, as shown in FIG. 24, As is mixed at the mixed epitaxial step of the trenches 4.

In the case where, after the formation of the trenches 4 in the n epitaxial film on the n⁺ silicon substrate 1, the epitaxial growth is performed while dichlorosilane (DCS), HCl and H₂ are kept flowing, As diffuses from the back surface and outer peripheral surface (end part) of the n⁺ silicon substrate 1 and reaches the p/n column. In this manner, due to the mixing of HCl, As in the n⁺ substrate is etched to adhere on the front surface of this substrate.

Figure 8:
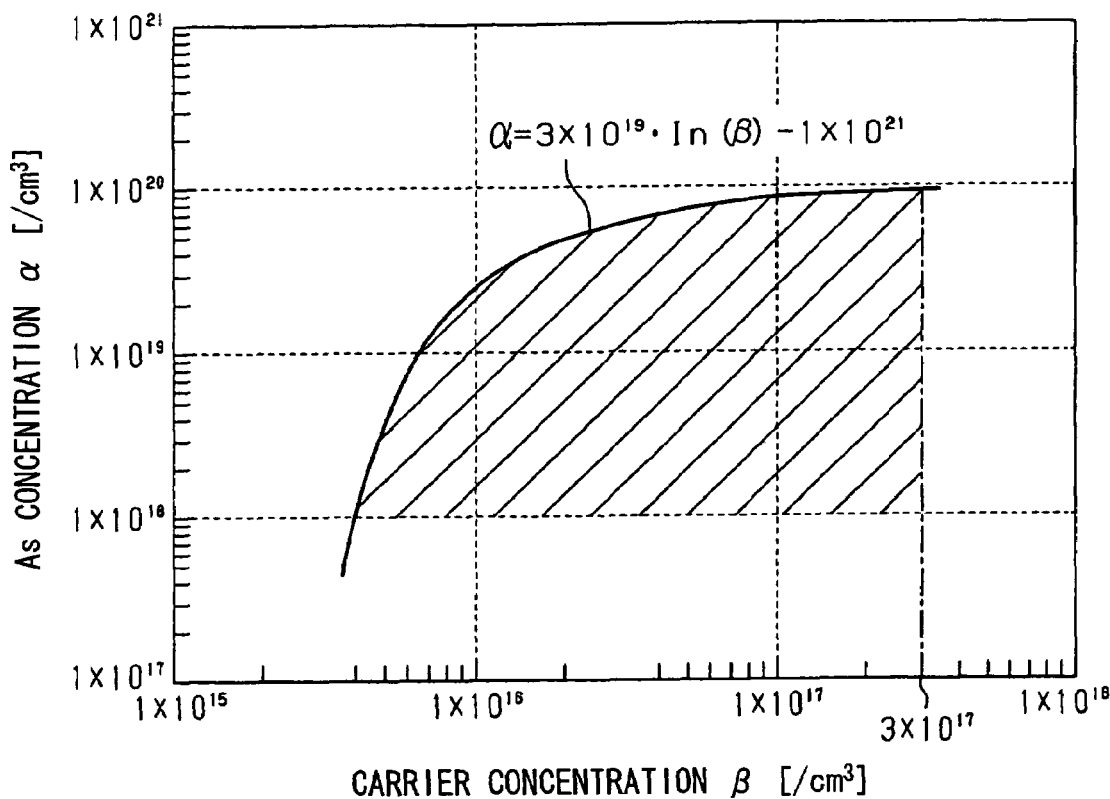
FIG. 8 is a graph showing a relationship between a carrier concentration of a filled epitaxial layer and a As concentration in a $n^+$ substrate.

In this embodiment, as shown in FIG. 8, when "α" is let denote the concentration of arsenic being the impurity of the silicon substrate 1, and "β" is let denote the impurity concentration of the p-type epitaxial film 23 (filled-epitaxial-layer carrier concentration), the next relationship is obtained.

$$\alpha \leq 3\times10^{19}\times\ln(\beta)-1\times10^{21} \tag{F4}$$

The following is considered in this condition: Regarding the upper limit of an As concentration in the n⁺ substrate, a concentration deviation on the order of ±10% occurs due to a machining precision in manufacture, in the case of forming the p/n column by the epitaxial film formation (that is, the concentration controllability of the filling epitaxial step is about 10%). Accordingly, the influence of the As mixing should desirably be suppressed to, at most, 10% of the carrier concentration in that column of the p/n column which is to be formed by the filling epitaxial step.

By way of example, in the relation between the As concentration in the n⁺ substrate and the quantity of the mixing of arsenic (As) into the column, the mixing quantity of arsenic (As) into the column enlarges more as the As concentration in the n⁺ substrate becomes higher. That is, an As outdiffusion quantity during the mixed epitaxial film formation can be suppressed by lowering the As concentration in the n⁺ substrate which acts as an As mixing source. Concretely, a p region concentration in the p/n column of the SJ-MOS is on the order of $1 \times 10^{16}$ to $3 \times 10^{17}/cm^3$. On the basis of these facts, an inferior breakdown voltage ascribable to the As mixing in practical use can be suppressed in such a way that the As mixing quantity is made, at most, 10% of the p region concentration in the p/n column. In this way, FIG. 8 has been experimentally found out premising that the As concentration in the n⁺ substrate is made, at most, 10% of the impurity concentration of the p-type epitaxial film.

Regarding the lower limit of the As concentration in the n⁺ substrate in FIG. 8, As exhibits the greatest solid-solubility in the silicon substrate in forming the substrate of n⁺ type. An Sb concentration is, in general, on the order of $10^{18}/cm^3$. Since, however, the saturation vapor of As in vacuum is high, the influence of the outdiffusion of As is great. Accordingly, the lower limit of the As substrate-concentration is set at $1 \times 10^{18}/cm^3$ at which the As substrate can be replaced with an Sb substrate. Therefore, the favorable range of the As substrate concentration is a $\alpha \leq 3 \times 10^{19} \times \ln(\beta) - 1 \times 10^{21}$, and besides, $\alpha > 1 \times 10^{18}$.

Besides, the upper limit of the filled-epitaxial-layer carrier concentration in FIG. 8 (the impurity concentration of the epitaxial film 23) is made at most $3 \times 10^{17}/cm^3$ in order to fully deplete the super junction. Therefore, the more favorable range of the As substrate concentration is $\alpha \leq 3 \times 10^{19} \times \ln(\beta) - 1 \times 10^{21}$, $\alpha > 1 \times 10^{18}$, and besides, $\beta < 3 \times 10^{17}$.

Next, there will be described a method of evaluating a semiconductor substrate which has a super junction structure.

The propriety of the carrier concentration distribution of the super junction structure is decided in such a way that, while primary ions are being bombarded onto a front surface so as to expose the front surface in a depthwise direction, regarding a predetermined planar region (SIMS analysis region in FIGS. 9 and 10) at a part having the super junction structure, namely, a predetermined region including pluralities of p-type impurity diffusion regions (5) and n-type impurity diffusion regions (6), emitted secondary ions are subjected to mass spectrometry, thereby to analyze elements of mean concentrations in the depthwise direction among the n-type constituent element of the impurity diffusion regions (6), the p-type constituent element of the impurity diffusion regions (5) and the impurity constituent element of the silicon substrate.

The evaluating method will be described in detail below.

An inspection which analyzes the concentrations of a p/n column structure substrate having a two-dimensional periodic structure, is chiefly performed twice as stated below.

In a manufacturing process for a vertical super junction MOS device, a substrate performance inspection is executed after the completion of the substrate. The device is fabricated in the substrate which is a non-defective unit, and a finish inspection and a defect analysis are executed after the completion of the device.

Here, in the substrate performance inspection in a p/n column substrate working process and the finish inspection and defect analysis in the case where a power device such as the SJ-MOS has been formed using the p/n column substrate, a prior-art semiconductor substrate evaluation technique (such as spread resistance measurement method, CV measurement method or secondary-ion mass spectrometry) is such that the size of a column (the width of the p-type region (5) or n-type region 6 in FIG. 2) is about 0.5 μm to 5 μm, while the size of a detection probe is several mm to several tens μm in diameter, so the probe cannot be brought into accurate touch with each column, and the concentration evaluation of each individual p/n column is impossible. In evaluating and managing impurity concentrations in the p/n column, therefore, it is common to form a planar epitaxial film on a monitor wafer under the same conditions and to evaluate the impurity concentrations of the monitor wafer in substitution for the concentration distribution of each p/n column. However, when the technique in the case where a p-type epitaxial film has been formed on an n substrate as shown in FIG. 11B (evaluation based on the planar epitaxial film) is directly applied, drawbacks as stated below are involved in the case of this embodiment.

Figure 11A:
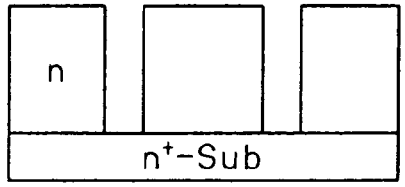
FIGS. 11A to 11D are cross sectional views explaining a method for evaluating a substrate.
Figure 11B:
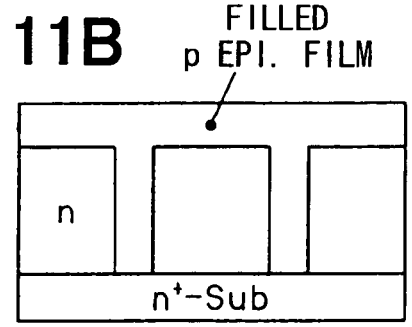
Figure 11C:
Figure 11D:
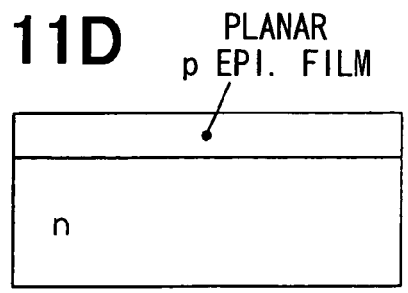

First, in a case where the p-type epitaxial film is formed so as to fill trenches as shown in FIGS. 11A and 11B, the influence of a shape by the filling of each trench cannot be evaluated (it is impossible to evaluate, for example, the influence ascribable to the fact that a gas becomes difficult to be supplied into each trench). Secondly, each trench has the plurality of inner surfaces of a bottom surface and side surfaces, and the influence of a face orientation cannot be evaluated. Thirdly, the influence of a distribution in a depthwise direction, such as the influence of the flow of the gas, cannot be evaluated. In this manner, in the case of FIGS. 11A and 11B, the evaluation by the prior-art scheme is impossible. In the case of FIGS. 11C and 11D, the evaluation by the prior-art scheme is possible, but the influences of a column shape, etc. are unknown.

Figure 9:
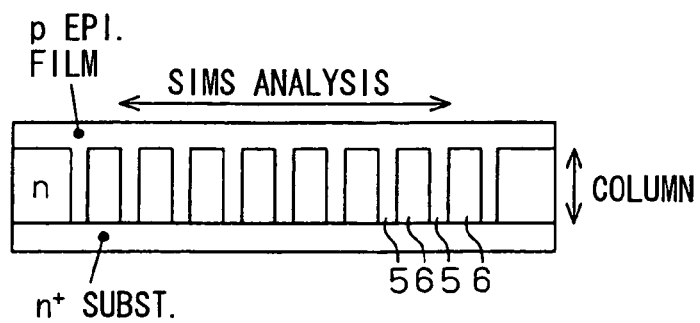
FIG. 9 is a cross sectional view explaining a SIMS analysis region.
Figure 10:
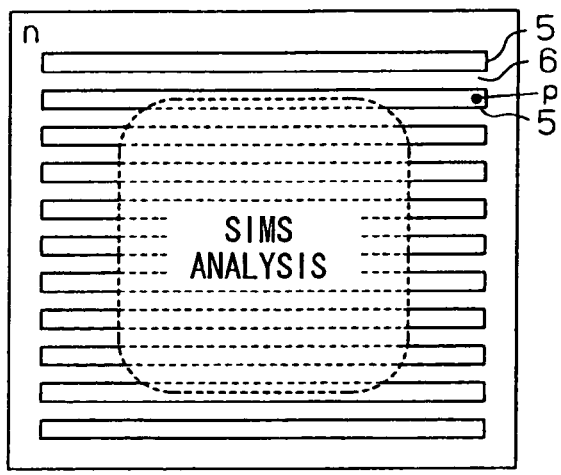
FIG. 10 is a plan view explaining the SIMS analysis region in FIG. 9.

Therefore, the analysis is made by the secondary-ion mass spectrometry (SIMS) from the front surface of the periodic structure of the p/n columns as shown in FIGS. 9 and 10, whereby the depthwise analysis of the mean impurity concentrations of each p/n column within a detection region (several tens to hundred μm-square) becomes possible. This method simultaneously evaluates the p epitaxial film filled in the periodic structure of trenches arranged at equal intervals and widths, and the n epitaxial film on the substrate, thereby to detect the mean concentrations of both the regions. Accordingly, when a trench structure within an evaluation region is held constant, the propriety of the concentration distribution in the p/n column can be decided by making the depthwise analysis.

Cases where such an evaluation method is applied, will be described by mentioning examples.

FIG. 12 shows SIMS results in the case where epitaxial growth was performed by employing dichlorosilane (DCS) as a silicon source gas and without adding hydrogen chloride. An As concentration was $7 \times 10^{19}/cm^3$. It is seen from FIG. 12 that the difference between a phosphorus (P) concentration and a boron (B) concentration at a depth of 4 to 12 μm is large, so a favorable concentration distribution is not attained. Besides, an arsenic (As) concentration is very low, and it is concretely $1 \times 10^{15}/cm^3$ or below.

Figure 13:
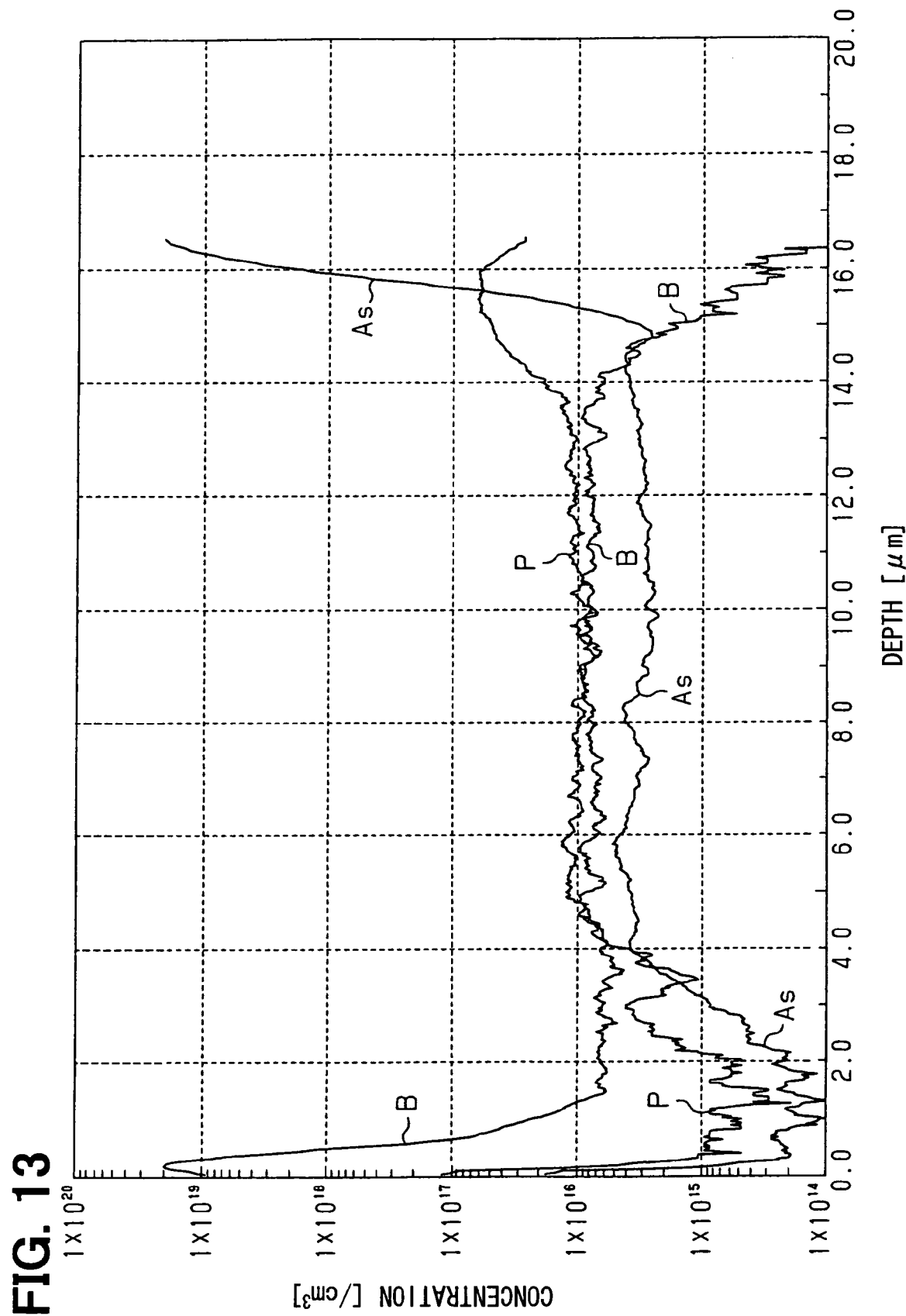
FIG. 13 is a graph showing a result of mass analysis.

FIG. 13 shows SIMS results in the case where epitaxial growth was performed by employing DCS as a silicon source gas and adding hydrogen chloride. An As concentration was $7 \times 10^{19}/cm^3$. It is seen from FIG. 13 that the difference between a P concentration and a B concentration at a depth of 4 to 12 μm is small. Besides, in FIG. 13, the As concentration is very high, and it is concretely $1 \times 10^{15}/cm^3$ or above. The reason therefor is that, as shown in FIG. 24, the As of a substrate is etched to adhere onto the front surface thereof, due to the mixing of hydrogen chloride. Especially, As diffuses from the back surface and outer peripheral surface of the substrate and pollutes p/n columns.

Figure 14:
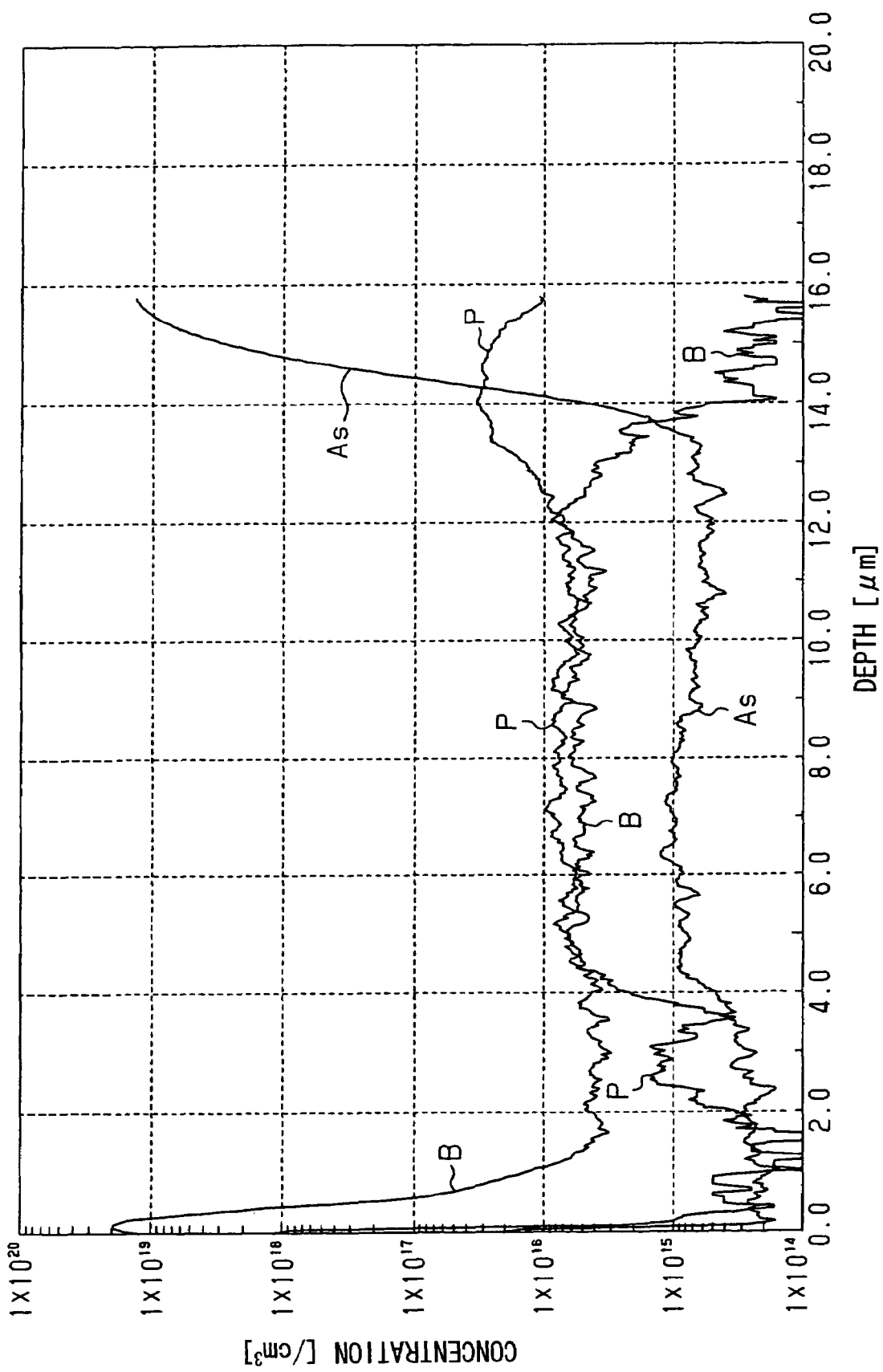
FIG. 14 is a graph showing a result of mass analysis.

FIG. 14 shows SIMS results in the case where epitaxial growth was performed by employing DCS as a silicon source gas and adding hydrogen chloride. Here, an As concentration was $4 \times 10^9/cm^3$. It is seen from FIG. 14 that the difference between a P concentration and a B concentration at a depth of 4 to 12 μm is small. Besides, in FIG. 14, the As concentration can be made low, and it is concretely about $1 \times 10^{15}/cm^3$ or below.

Incidentally, in obtaining the boron concentration [$N_B$] and phosphorus concentration [$N_P$] of each p/n column, the concentrations can be derived from relational formulas below where "$N_{exp-B}$" and "$N_{exp-P}$" are respectively let denote the boron concentration and phosphorus concentration detected by the SIMS, and "$W_B$" and "$W_P$" are respectively let denote a p layer width and an n layer width.

$$N_B = N_{exp-B} \times (W_B + W_P)/W_B \tag{F5}$$

$$N_P = N_{epx-P} \times (W_B + W_P)/W_P \tag{F6}$$

By way of example, if the boron concentration or $N_{exp-B}$ at the depth of 2 μm in FIG. 14 is $5 \times 10^{15}/cm^3$, and $W_B = W_P$ holds, the boron concentration $N_B$ becomes $10 \times 10^{15}/cm^3$ (=$5 \times 10^{15} \times 2/1$).

According to the embodiment, advantages as stated below can be brought forth.

(1) A method of manufacturing a semiconductor substrate, including the first step of overlaying an n$^+$ silicon substrate (silicon substrate of first conductivity type) with an n-type epitaxial film (epitaxial film of the first conductivity type) 2 which is lower in impurity concentration than the silicon substrate 1, the second step of forming trenches 4 in the epitaxial film 2 on the silicon substrate 1, and the third step of forming an epitaxial film 23 of p type (second conductivity type) on the n-type epitaxial film 2 including the trenches 4, thereby to fill the trenches 4 with the p-type epitaxial film 23, wherein at, at least, a final filling step in the case where the trenches 4 are filled with the p-type epitaxial film 23 at the third step, a mixed gas which consists of a silicon source gas and a halide gas is employed as a gas which is supplied for the formation of the p-type epitaxial film 23, and when "α" is let denote the concentration of arsenic being the impurity of the silicon substrate 1, and "Θ" is let denote the impurity concentration of the p-type epitaxial film 23, the next relationship is satisfied.

$$\alpha \leq 3 \times 10^{19} \times \ln(\beta) - 1 \times 10^{21} \tag{F7}$$

Thus, in the case where, at the third step, the p-type epitaxial film 23 is formed on the n-type epitaxial film 2 including the trenches 4, thereby to fill the trenches 4 with the p-type epitaxial film 23, the mixing quantity of As can be suppressed. As a result, a desired carrier distribution can be attained in a semiconductor substrate in which the trenches 4 formed in the epitaxial film 2 on the silicon substrate 1 are filled with the epitaxial film 23 being opposite in conductivity type to the epitaxial film 2.

As a semiconductor substrate having a super junction structure, when "α" is let denote the concentration of arsenic being the impurity of the silicon substrate 1, and "β" is let denote the impurity concentration of the p-type epitaxial film 5, $$\alpha \leq 3 \times 10^{19} \times \ln(\beta) - 1 \times 10^{21} \tag{F8}$$

Besides, the structure of a vertical super junction MOS device is configured by employing this semiconductor substrate. The same advantage is achieved also in these structures.

(2) At, at least, the final filling step in the case where the trenches 4 are filled with the p-type epitaxial film 23, as the film formation condition of the epitaxial film 23, a growth rate at the open part of each trench is made lower than a growth rate at a part deeper than the trench open part, as to the epitaxial film which is grown on the side surface of each trench, whereby the closure of the trench open part by the epitaxial film 23 can be suppressed to enhance the fillability of each trench.

(3) Letting X [slm] denote the standard flow rate of the halide gas, and Y [μm/min] denote a growth rate, in the case where the p-type epitaxial film 23 is formed in order to fill the trenches 4 at the third step, the next relationship is satisfied in a case where the aspect ratio of each trench 4 is less than 10.

$$Y < 0.2X + 0.1 \tag{F9}$$

In a case where the aspect ratio of each trench 4 is at least 10 and less than 20, the next relationship is satisfied.

$$Y < 0.2X + 0.05 \tag{F10}$$

In a case where the aspect ratio of each trench 4 is at least 20, the next relationship is satisfied.

$$Y < 0.2X \tag{F11}$$

Then, the film formation becomes favorable from the viewpoint of efficiently filling the trenches with the epitaxial film while the appearance of voids is suppressed.

(4) A method of evaluating a semiconductor substrate having a super junction structure in which an n$^+$ silicon substrate 1 is overlaid with an epitaxial film 2 of n-type which is lower in impurity concentration than the silicon substrate 1, while trenches 4 formed in the n-type epitaxial film 2 are filled with an epitaxial film 5 of p-type, whereby impurity diffusion regions 6 of the n-type extending in a depthwise direction and impurity diffusion regions (5) of the p-type similarly extending in the depthwise direction are arranged in large numbers in a state where they are adjacent to one another in a planar direction, wherein in the predetermined region of a plane at a part having a super junction structure as includes, at least, the pluralities of n-type impurity diffusion regions 6 and p-type impurity diffusion regions (5), while primary ions are being bombarded onto a front surface to expose the front surface in the depthwise direction, emitted secondary ions are subjected to mass spectrometry, thereby to analyze elements of mean concentrations in the depthwise direction among the n-type dopant of the impurity diffusion regions 6, the p-type dopant of the impurity diffusion regions (5) and the dopant of the silicon substrate 1, and to decide propriety for the carrier concentration distribution of the super junction structure.

Thus, even in the case where the epitaxial film 23 of the opposite conductivity type is formed so as to fill the trenches 4, the semiconductor substrate can be evaluated in consideration of the influence of a shape, the influence of a face orientation and the influence of the depthwise distribution attributed to the filling of the trenches.

Second Embodiment

Next, a second embodiment will be described chiefly on the point of difference from the first embodiment.

Figure 15:
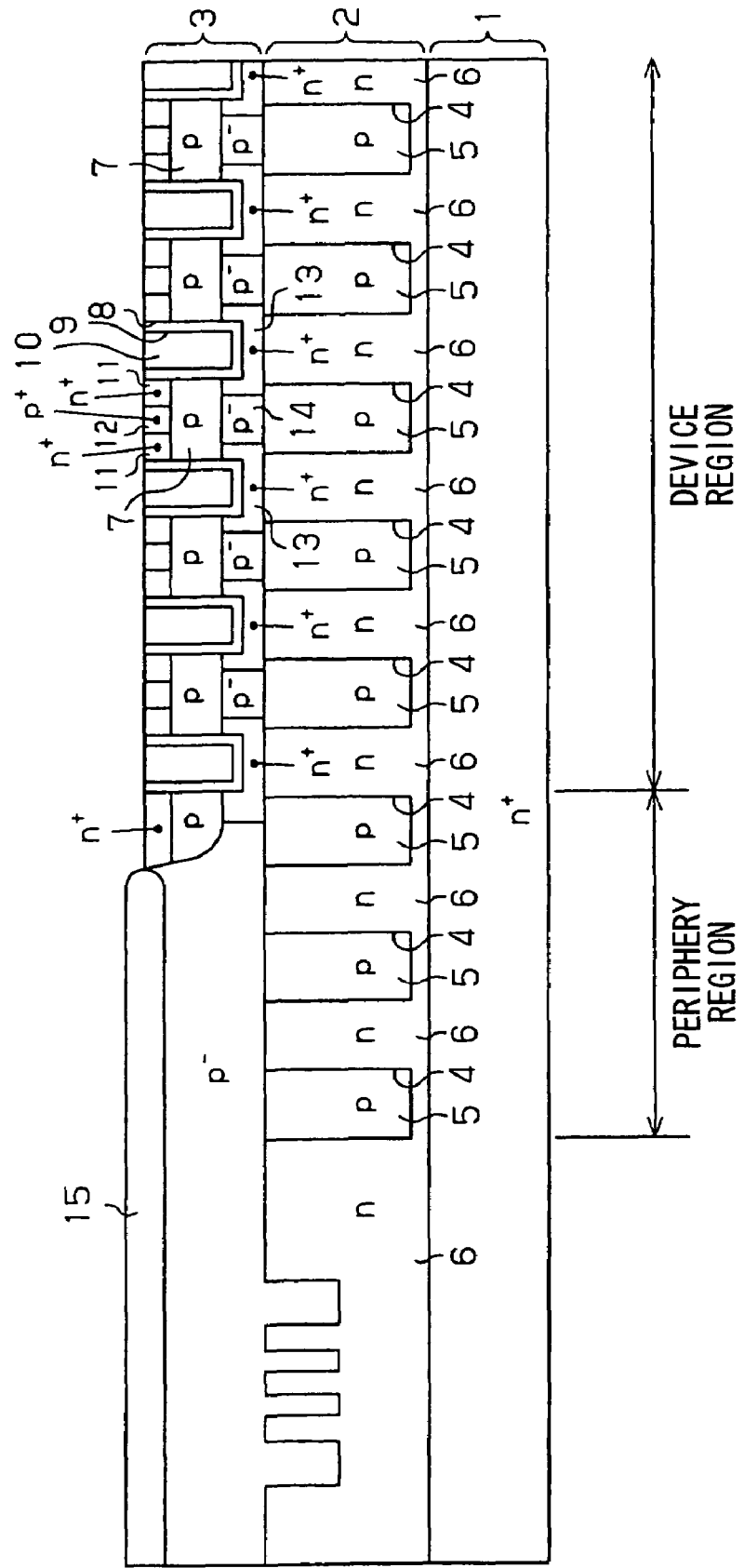
FIG. 15 is a cross sectional view showing another vertical trench gate type MOSFET.

A sectional view of a vertical trench gate MOSFET in this embodiment is shown in FIG. 15 replacing FIG. 1.

As shown in FIG. 15, in this embodiment, the bottom part of each trench 4 does not reach an n+ silicon substrate 1, but it lies within an n-type epitaxial film 2.

Therefore, a manufacturing process becomes as described below.

Figure 16A:
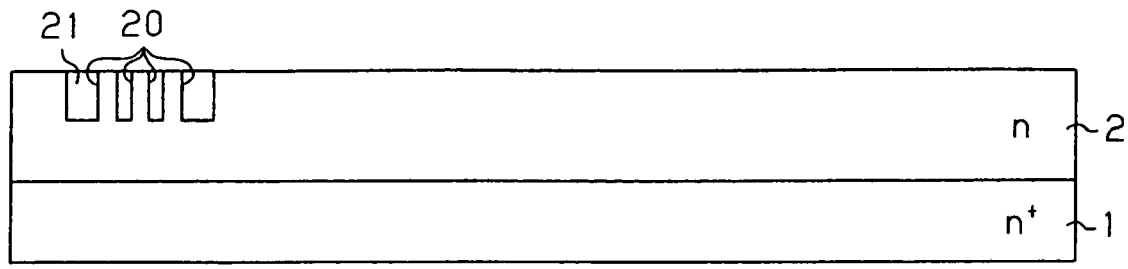
FIGS. 16A to 16D are cross sectional views explaining a method for manufacturing the MOSFET in FIG. 15.
Figure 16B:
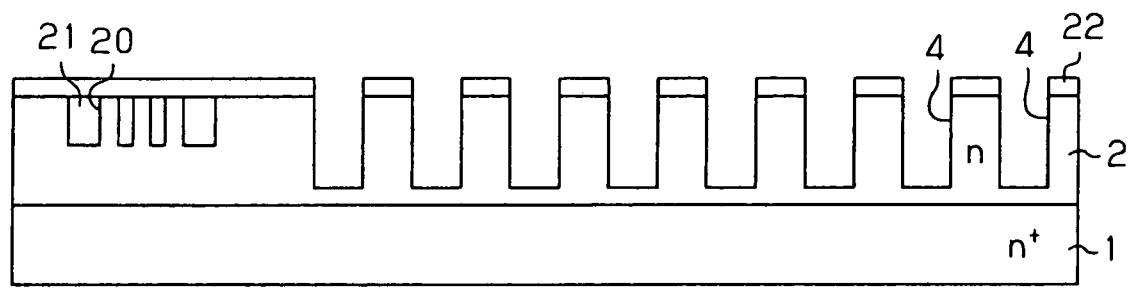

As shown in FIG. 16A, the formation of the n-type epitaxial film 2 on the n+ silicon substrate 1, the formation of trenches 20, the filling of the trenches 20 with silicon oxide films 21, and the flattening of the n-type epitaxial film 2 are performed. Thereafter, as shown in FIG. 16B, etching is ended before its arrival at the silicon substrate 1, at a trench formation step for the n-type epitaxial film 2 as employs a silicon oxide film 22 on the n-type epitaxial film 2. Thus, the bottom surface of each trench 4 comes to lie within the n-type epitaxial film 2.

Figure 16C:
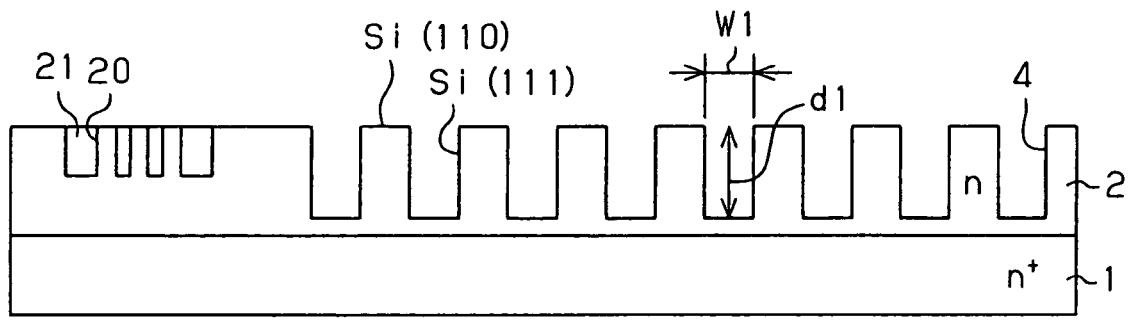
Figure 16D:
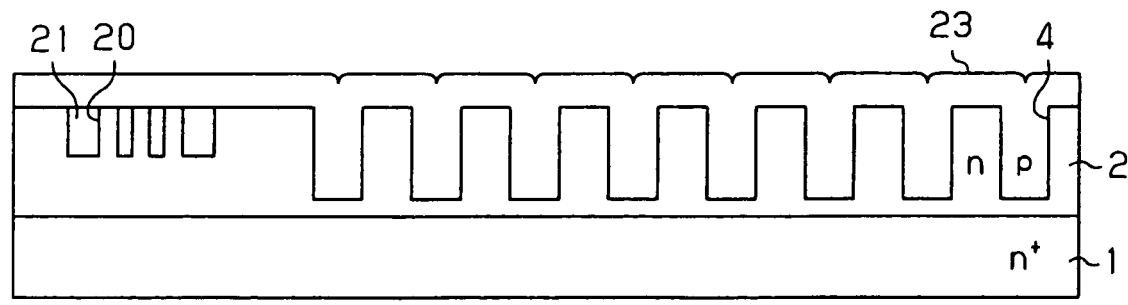

Subsequently, as shown in FIG. 16C, the silicon oxide film 22 used as a mask is removed, and as shown in FIG. 16D, using a mixed gas which consists of a silicon source gas and a halide gas, a p-type epitaxial film 23 is formed on the epitaxial film 2 including the inner surfaces of the trenches 4, thereby to fill the trenches 4 with the epitaxial film 23. On this occasion, the n+ silicon substrate 1 is not exposed within the trenches 4, so that arsenic (As) within the n+ silicon substrate 1 does not scatter through the internal parts of the trenches 4.

Figure 17A:
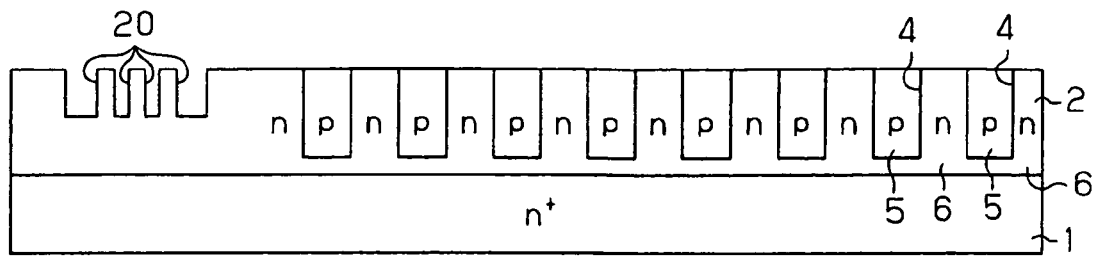
FIGS. 17A to 17D are cross sectional views explaining the method for manufacturing the MOSFET in FIG. 15.
Figure 17B:
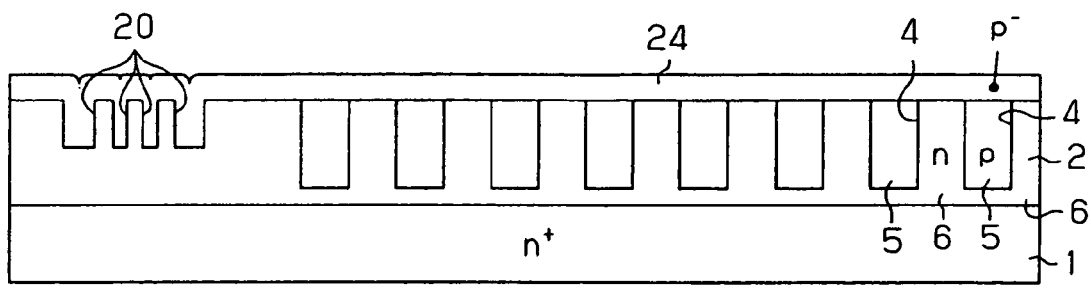
Figure 17C:
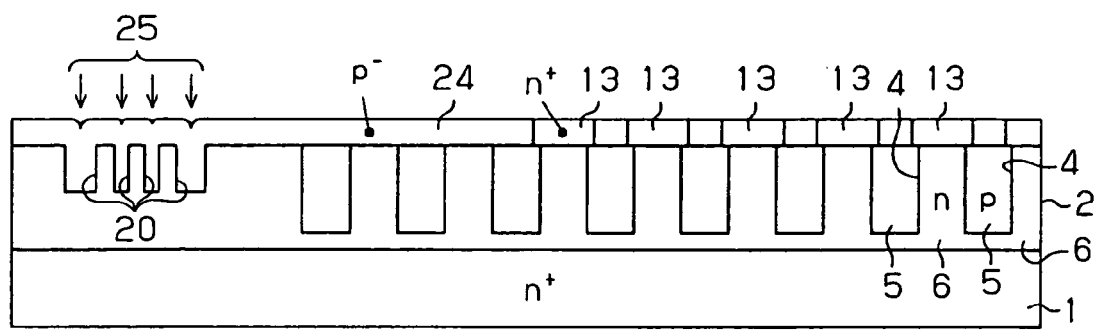
Figure 17D:
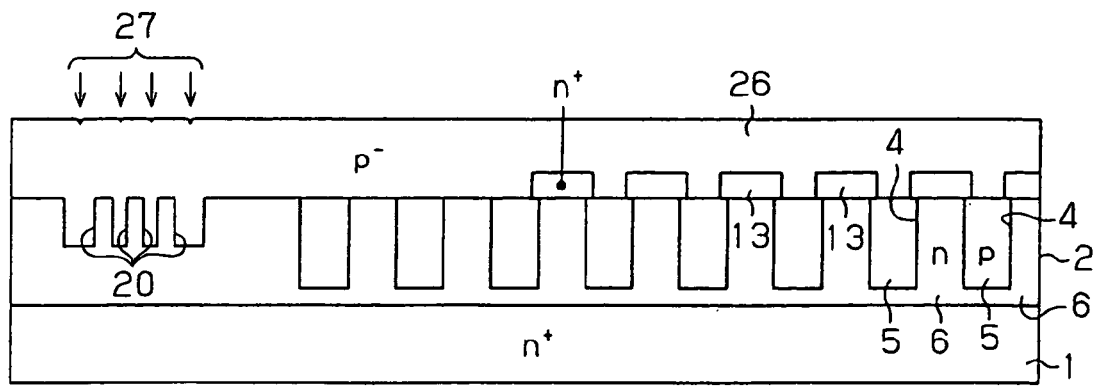

Thereafter, there are performed the flattening polishing of the resulting structure from the upper surface side of the epitaxial film 23 as shown in FIG. 17A, the formation of a p$^-$-type epitaxial film 24 on the epitaxial film 2 as shown in FIG. 17B, the formation of n$^-$ buffer regions 13 as shown in FIG. 17C, and the formation of a p$^-$-type epitaxial film 26 on the p$^-$-type epitaxial film 24 as shown in FIG. 17D.

Besides, a LOCOS oxide film 15, p well layers 7, trenches 8, gate oxide films 9, poly-silicon gate electrodes 10, n+ source regions 11 and p+ source contact regions 12 are formed as shown in FIG. 15.

According to the embodiment, an advantage as stated below can be brought forth.

In forming the trenches 4 at the second step, the trenches 4 are formed so as not to reach the silicon substrate 1, whereby the silicon substrate 1 is exposed to the bottom surfaces of the trenches, so that the mixing of As from the corresponding parts can be prevented.

Third Embodiment

Next, a third embodiment will be described chiefly on the point of difference from the first embodiment.

Figure 18A:
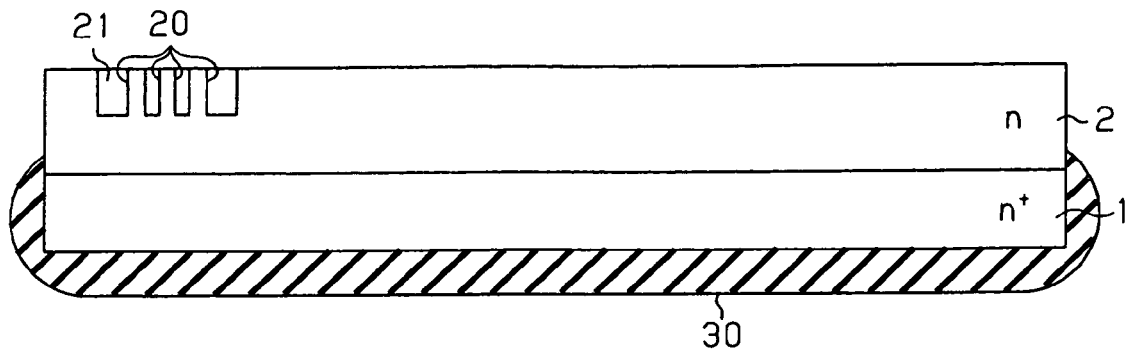
FIGS. 18A to 18D are cross sectional views explaining a method for manufacturing further another vertical trench gate type MOSFET.

In this embodiment, as the structure of a semiconductor substrate, the back surface and outer peripheral surface of a silicon substrate 1 are covered with a protective film 30 as shown in FIG. 18A. A manufacturing process will be described below.

As shown in FIG. 18A, an epitaxial film 2 of n-type is formed on the n+ silicon substrate 1. Besides, the lower surface (back surface) of the n+ silicon substrate 1 and the side surface (outer peripheral surface) thereof are covered with the protective film 30. A silicon oxide film, a silicon nitride film, a polycrystalline silicon film, or the like is used as the protective film 30. Subsequently, there are performed the formation of trenches 20, the filling of the trenches 20 with silicon oxide films 21, and the flattening of the n-type epitaxial film 2.

Figure 18B:
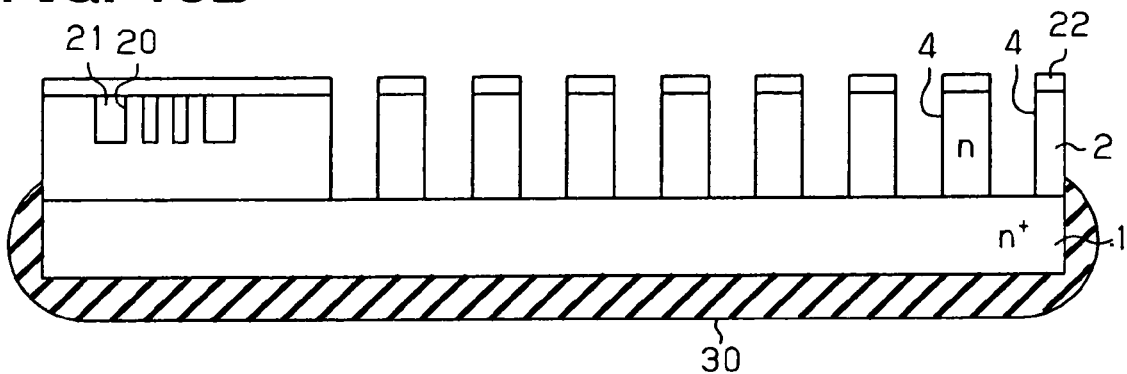
Figure 18C:
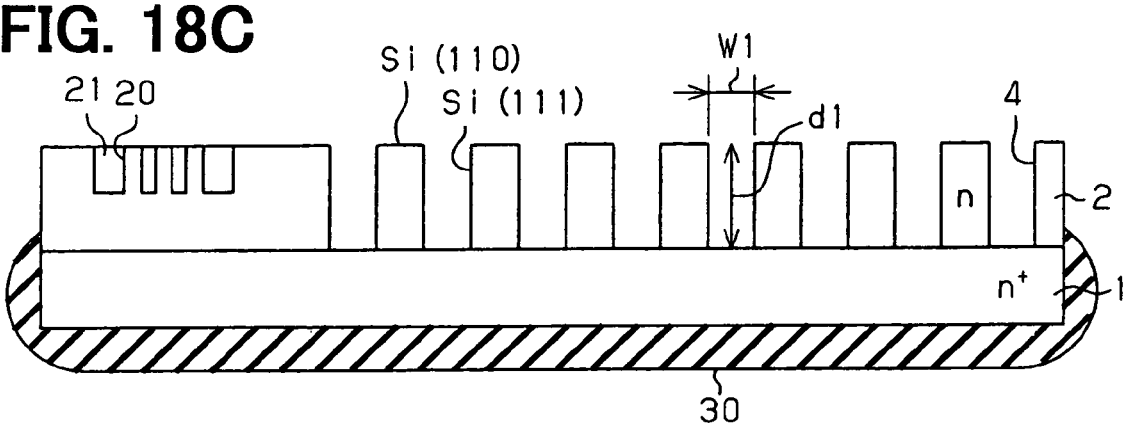
Figure 18D:
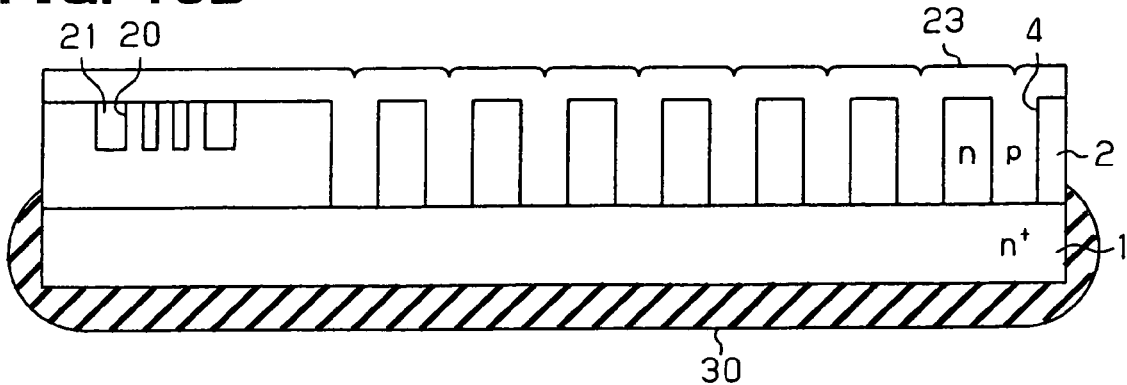

Thereafter, as shown in FIG. 18B, trenches 4 are formed in the n-type epitaxial film 2 by employing a silicon oxide film 22 on the n-type epitaxial film 2, and as shown in FIG. 18C, the silicon oxide film 22 used as a mask is employed. Thereafter, as shown in FIG. 18D, using a mixed gas which consists of a silicon source gas and a halide gas, a p-type epitaxial film 23 is formed on the epitaxial film 2 including the inner surfaces of the trenches 4, thereby to fill the trenches 4 with the epitaxial film 23. On this occasion, the lower surface (back surface) and side surface (outer peripheral surface) of the n+ silicon substrate 1 are covered with the protective film 30, so that the scattering of arsenic (As) within the n+ silicon substrate 1 can be suppressed.

Figure 19A:
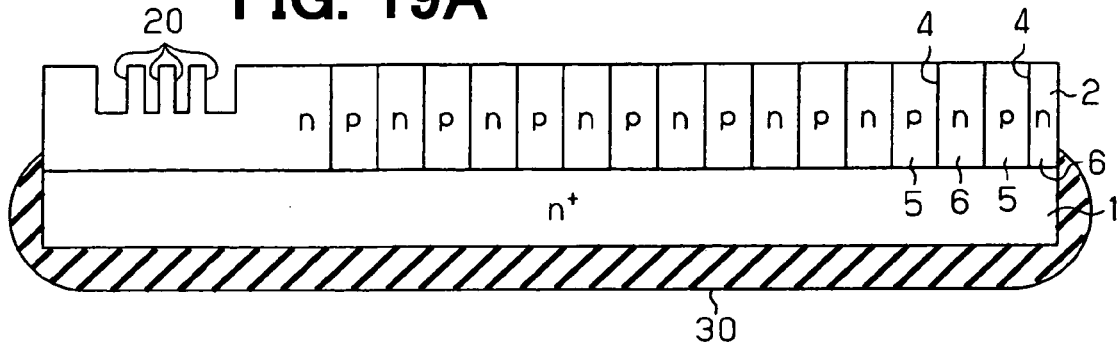
FIGS. 19A to 19D are cross sectional views explaining the method for manufacturing the MOSFET in FIGS. 18A to 18D.
Figure 19B:
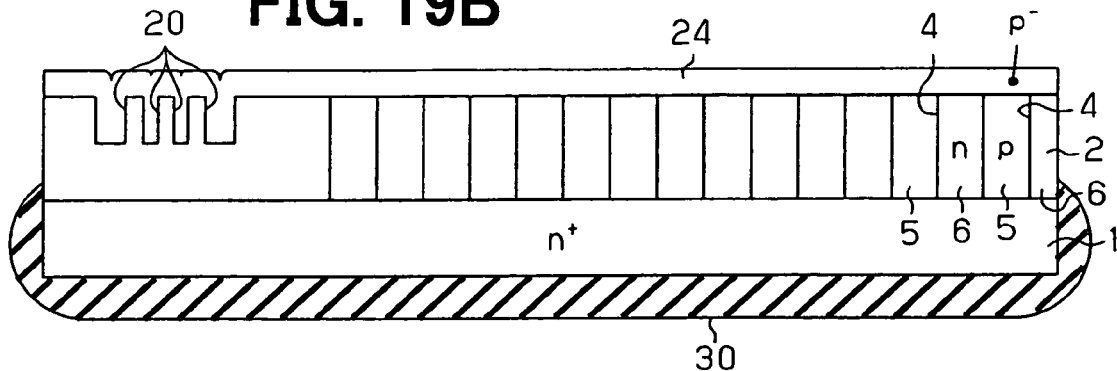
Figure 19C:
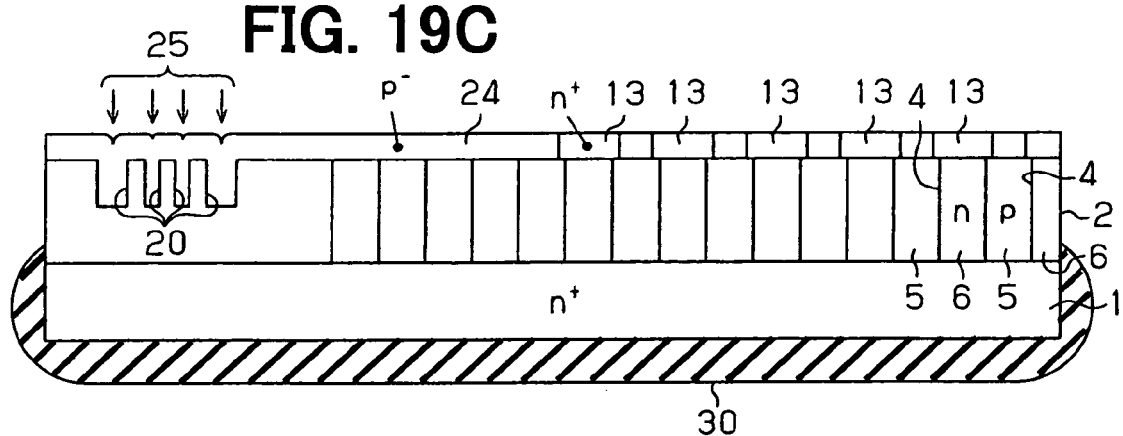
Figure 19D:
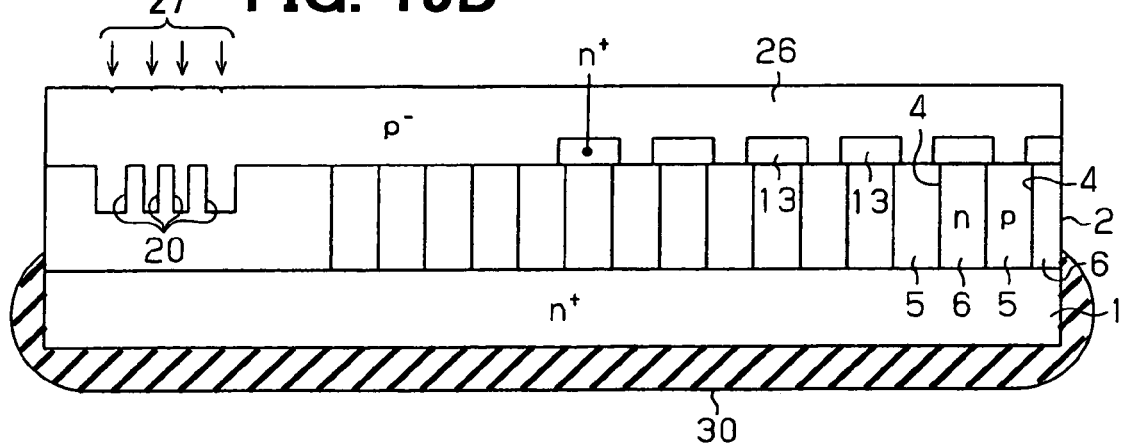

Thereafter, there are performed the flattening polishing of the resulting structure from the upper surface side of the epitaxial film 23 as shown in FIG. 19A, the formation of a p$^-$-type epitaxial film 24 on the epitaxial film 2 as shown in FIG. 19B, the formation of n$^-$ buffer regions 13 as shown in FIG. 19C, and the formation of a p-type epitaxial film 26 on the p$^-$-type epitaxial film 24 as shown in FIG. 19D. Thereafter, the protective film 30 is removed.

According to the embodiment, an advantage as stated below can be brought forth.

In filling the trenches 4 with the p-type epitaxial film 23, the trenches 4 are filled with the p-type epitaxial film 23 in the state where the back surface and outer peripheral surface of the silicon substrate 1 are covered with the protective film 30, whereby the silicon substrate 1 is not exposed on the back surface and outer peripheral surface of the silicon substrate 1, so that the mixing of As from the corresponding parts can be prevented.

It is allowed to combine the configuration of the third embodiment (in which the protective film is used) and the configuration of the second embodiment (in which the trenches are formed so as not to reach the substrate).

Fourth Embodiment

Next, a fourth embodiment will be described chiefly on the point of difference from the first embodiment.

FIGS. 20A to 20D and FIGS. 21A to 21D are schematic sectional views showing a manufacturing process for a semiconductor substrate in this embodiment.

Figure 20A:
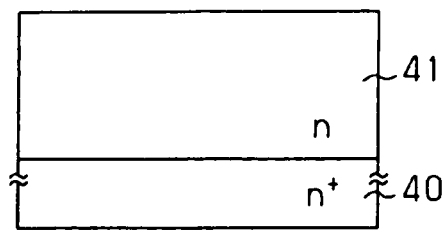
FIGS. 20A to 20D are cross sectional views explaining a method for manufacturing another vertical trench gate type MOSFET.
Figure 20B:
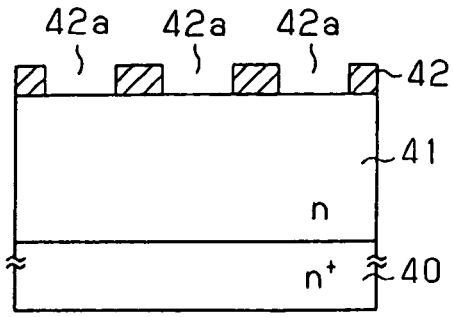
Figure 20C:
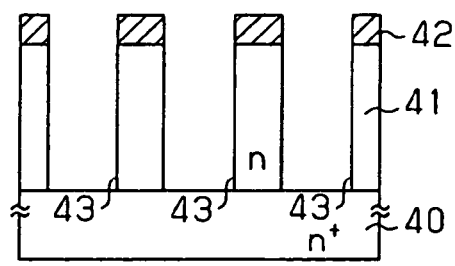

First, as shown in FIG. 20A, an n+ silicon substrate 40 is prepared, and an n-type epitaxial film 41 is formed thereon. The n+ silicon substrate 40 employs As (arsenic) as an impurity. Besides, as shown in FIG. 20B, a silicon oxide film 42 to serve as an etching mask is formed on the upper surface of the epitaxial film 41, and after the silicon oxide film 42 is coated with a resist material, it is formed with openings 42a in desired regions by photolithography. Further, as shown in FIG. 20C, trenches 43 are formed in the epitaxial film 41 by using the silicon oxide film 42 as the mask. That is, anisotropic etching is performed from the openings 42a by dry etching, thereby to form the trenches 43.

Figure 20D:
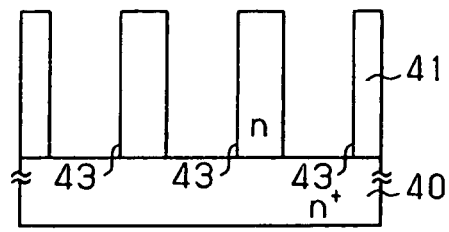
Figure 21A:
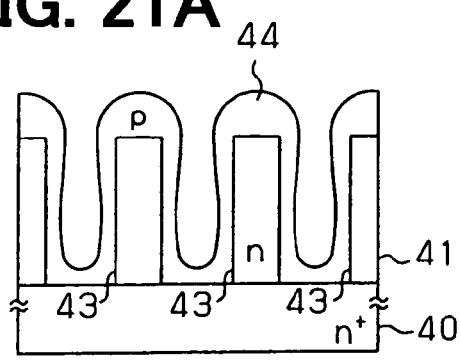
FIGS. 21A to 21D are cross sectional views explaining the method for manufacturing the MOSFET in FIGS. 20A to 20D.

Subsequently, as shown in FIG. 20D, the oxide film 42 employed as a mask material is removed, and as shown in FIG. 21A, a p-type epitaxial film 44 is formed on the epitaxial film 41 including the trenches 43, by epitaxial growth.

Figure 21B:
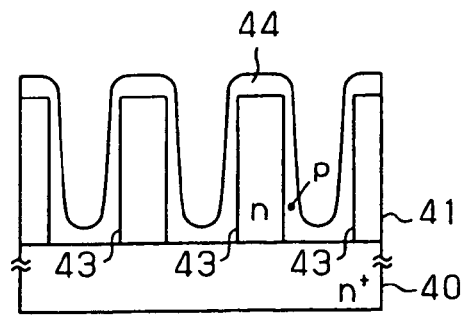
Figure 21C:
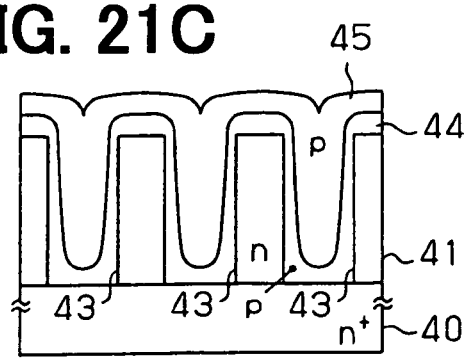

Subsequently, as shown in FIG. 21B, the epitaxial film 44 is subjected to the etching of the open parts of the trenches 43 by introducing HCl gas. The etching of the open parts is not restricted to HCl, but $H_2$ gas which has an etching action for the silicon film may well be employed. In the $H_2$ etching, a gas flow rate determining condition should desirably be employed as in the HCl etching. In this manner, the open parts of the trenches 43 are etched by performing the etching process of parts of the epitaxial film 44. Thereafter, as shown in FIG. 21C, a p-type epitaxial film 45 is formed to fill the trenches 43. On this occasion, the trench open parts have been widened by the etching after the formation of the epitaxial film 44, so that the open parts of the trenches can be prevented from being closed, and the fillability thereof is enhanced.

By the way, in a case where the trench open parts are closed to give rise to any filling defect (cavity), even by the re-epitaxial growth, the fillability is enhanced by repeating the HCl etching step of the epitaxial film 45 and the epitaxial growth step again. That is, each of the etching process of parts of the p-type epitaxial film and the formation process of the p-type epitaxial film are performed a plurality of times, thereby to fill the trenches with the stacked p-type epitaxial films.

Figure 21D:
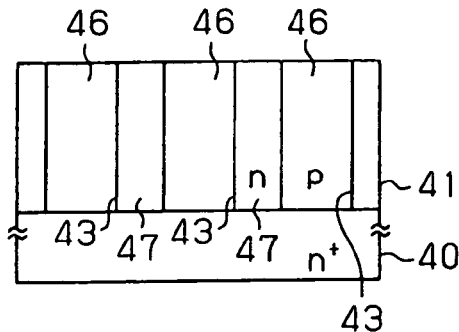

Besides, the surfaces of the epitaxial films 44 and 45 on the substrate (40, 41) are flattened after the filling epitaxial growth, whereby steps remaining over the trenches 43 are removed as shown in FIG. 21D. Thus, the epitaxial film 46 is filled in the trench 43.

Also in this manufacturing method, when "α" is let denote the concentration of arsenic being the impurity of the silicon substrate 40, and "β" is let denote the impurity concentration of the p-type epitaxial films 44 and 45, the next relationship is satisfied.

$$\alpha \leq 3\times10^{19}\times\ln(\beta)-1\times10^{21} \tag{F12}$$

Therefore, although As diffusion occurs in the hydrogen-chloride etching process, an As mixing quantity in p/n columns can be made small.

According to this embodiment, an advantage as stated below can be brought forth.

A method of manufacturing a semiconductor substrate, including the first step of overlaying an n$^+$ silicon substrate (silicon substrate of first conductivity type) 40 with an epitaxial film of n-type (epitaxial film of the first conductivity type) 41 which is lower in impurity concentration than the silicon substrate 40, the second step of forming trenches 43 in the n-type epitaxial film 41 on the silicon substrate 40, the third step of forming an epitaxial film 44 of p type (second conductivity type) on the n-type epitaxial film 41 including the trenches 43, by epitaxial growth, and the fourth step of performing the etching process of parts of the p-type epitaxial film 44 and the formation process of an epitaxial film 45 of p type, once or a plurality of times, thereby to fill the trenches 43 with the stacked p-type (second conductivity type) epitaxial films 44 and 45, wherein when "α" is let denote the concentration of arsenic being the impurity of the silicon substrate 40, and "β" is let denote the impurity concentration of the p-type epitaxial film 44 and 45, the next relationship is satisfied.

$$\alpha \leq 3\times10^{19}\times\ln(\beta)-1\times10^{21} \tag{F13}$$

Thus, in performing the etching process of parts of the p-type epitaxial film 44 at the fourth step, the mixing quantity of As can be suppressed. As a result, a desired carrier distribution can be attained in a semiconductor substrate in which the trenches 43 formed in the epitaxial film 41 on the silicon substrate 40 are filled with the epitaxial films 44 and 45 being opposite in conductivity type to the epitaxial film 41.

Also in this embodiment, as described in the second embodiment, the trenches may well be formed so as not to reach the silicon substrate, in forming the trenches at the second step. Also in this case, the same advantage as in the second embodiment is achieved. Besides, in this embodiment, the technique described in the third embodiment may well be employed. That is, in performing the etching process of parts of the p-type epitaxial film 44, the etching process may well be performed in a state where the back surface and outer peripheral surface of the silicon substrate 40 are covered with a protective film. Also in this case, the same advantage as in the third embodiment is achieved.

Besides, also in this embodiment, the substrate can be evaluated by employing the evaluation method described with reference to FIGS. 9 and 10.

Incidentally, the evaluation method described with reference to FIGS. 9 and 10 can be applied to an evaluation method in the case where trenches are formed in a bulk substrate and are filled with an epitaxial film of opposite conductivity type.

Figure 22:
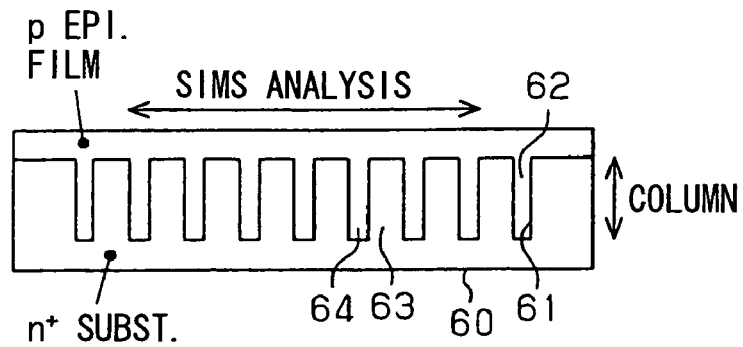
FIG. 22 is a cross sectional view explaining a SIMS analysis region.
Figure 23:
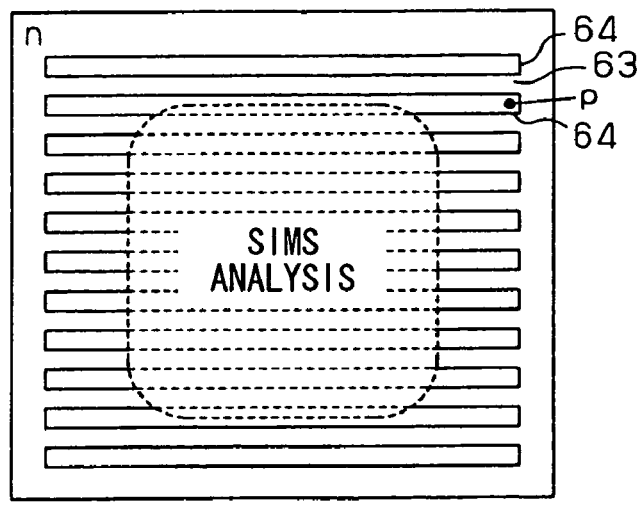
FIG. 23 is a plan view explaining the SIMS analysis region in FIG. 22.

More specifically, a method of evaluating a semiconductor substrate having a super junction structure in which, as shown in FIG. 22, trenches 61 formed in a silicon substrate 60 of n type (first conductivity type) is filled with an epitaxial film 62 of p type (second conductivity type), whereby impurity diffusion regions 63 of the n type extending in a depthwise direction and impurity diffusion regions 64 of the p type (second conductivity type) similarly extending in the depthwise direction are arranged in large numbers in a state where they are adjacent to one another in a planar direction, wherein in the predetermined region of a plane at a part having the super junction structure as includes, at least, the pluralities of n-type (first conductivity type) impurity diffusion regions 63 and p-type (second conductivity type) impurity diffusion regions 64 as shown in FIG. 23, while primary ions are being bombarded onto a front surface to expose the front surface in the depthwise direction, emitted secondary ions are subjected to mass spectrometry, thereby to analyze elements of mean concentrations in the depthwise direction among the n-type (first conductivity type) constituent element of the impurity diffusion regions 63 and the p-type (second conductivity type) constituent element of the impurity diffusion regions 64, and to decide propriety for the carrier concentration distribution of the super junction structure. Thus, even in the case where the epitaxial film 62 of the opposite conductivity type is formed so as to fill the trenches 61, the semiconductor substrate can be evaluated in consideration of the influence of a shape, the influence of a face orientation and the influence of the depthwise distribution attributed to the filling of the trenches.

In the description thus far made, the first conductivity type has been the n type, and the second conductivity type has been the p type, but the conductivity types may well be reversed so that the first conductivity type may be the p type and that the second conductivity type may be the n type (concretely, in FIG. 1, the substrate 1 is of p$^+$, the region (5) is of the n type, and the region 6 is of the p type).

The above disclosure has the following aspects.

According to a first aspect of the present disclosure, a method for manufacturing a semiconductor device includes steps of: forming a first epitaxial film having a first conductive type on a silicon substrate having the first conductive type, wherein the first epitaxial film has an impurity concentration lower than that of the silicon substrate; forming a trench in the first epitaxial film; and forming a second epitaxial film having a second conductive type on the first epitaxial film and in the trench so that the trench is filled with the second epitaxial film. The step of forming the second epitaxial film includes a final step, in which a mixed gas of a silicon source gas and a halide gas is used for forming the second epitaxial film. The silicon substrate has an arsenic concentration as the impurity concentration therein, which is defined as α. The second epitaxial film has an impurity concentration, which is defined as β. The arsenic concentration in the silicon substrate and the impurity concentration in the second epitaxial film has a relationship of: $\alpha \leq 3\times10^{19}\times\ln(\beta)-1\times10^{21}$.

In the above method, when the trench is filled with the second epitaxial film, an amount of arcencium to be introduced into the second epitaxila film is reduced. Thus, a carrier concentration distribution in the device is appropriately obtained.

Alternatively, in the final step of the step of forming the second epitaxial film, a growth rate of the second epitaxial film near an opening of the trench may be smaller than a growth rate of the second epitaxial film in the trench. In this case, the second epitaxial film does not block the opening of the trench before the trench is completely filled with the second epitaxial film. Thus, the trench is sufficiently filled with the second epitaxial film.

Alternatively, in the step of forming the second epitaxial film, a halide gas may be used for forming the second epitaxial film. The halide gas has a standard flow rate, which is defined as X in slm unit. The second epitaxial film is grown with a growth rate, which is defined as Y in unit of micron per minute. When the trench has an aspect ratio smaller than 10, the standard flow rate of the halide gas and the growth rate of the second epitaxial film has a relationship of: Y<0.2 X+0.1. In this case, the second epitaxial film has no void therein, and further, the trench is sufficiently filled with the second epitaxial film.

Alternatively, when the trench has an aspect ratio equal to or larger than 10 and smaller than 20, the standard flow rate of the halide gas and the growth rate of the second epitaxial film has a relationship of: Y<0.2 X+0.05.

Alternatively, when the trench has an aspect ratio equal to or larger than 20, the standard flow rate of the halide gas and the growth rate of the second epitaxial film has a relationship of: Y<0.2 X.

Alternatively, in the step of forming the trench, the trench may not reach the silicon substrate. In this case, the silicon substrate is not exposed on the bottom of the trench. Thus, the arsenic atom is not introduced into the second epitaxial film from the bottom of the trench.

Alternatively, the method may further include a step of: forming a protection film on one surface of the silicon substrate and on a side surface of the silicon substrate before the step of forming the second epitaxial film. The one surface of the silicon substrate is opposite to the first epitaxial film. In this case, the arsenic atom is not introduced into the second epitaxial film from the one surface and the side surface of the silicon substrate.

According to a second aspect of the present disclosure, a method for manufacturing a semiconductor device includes steps of: forming a first epitaxial film having a first conductive type on a silicon substrate having the first conductive type, wherein the first epitaxial film has an impurity concentration lower than that of the silicon substrate; forming a trench in the first epitaxial film; forming a second epitaxial film having a second conductive type on the first epitaxial film and in the trench; and etching a part of the second epitaxial film and forming the second epitaxial film on the first epitaxial film and in the trench so that the trench is filled with the second epitaxial film. The silicon substrate has an arsenic concentration as the impurity concentration therein, which is defined as $\alpha$. The second epitaxial film has an impurity concentration, which is defined as $\beta$. The arsenic concentration in the silicon substrate and the impurity concentration in the second epitaxial film has a relationship of: $\alpha \leq 3 \times 10^{19} \times \ln(\beta) - 1 \times 10^{21}$.

In the above method, since the part of the second epitaxial film is etched, and then, the second epitaxial film is formed on the first epitaxial film and in the trench, an amount of arcencium to be introduced into the second epitaxila film is reduced. Thus, a carrier concentration distribution in the device is appropriately obtained.

Alternatively, the method may further include a step of: forming a protection film on one surface of the silicon substrate and on a side surface of the silicon substrate before the step of etching the part of the second epitaxial film and forming the second epitaxial film. The one surface of the silicon substrate is opposite to the first epitaxial film. In this case, the arsenic atom is not introduced into the second epitaxial film from the one surface and the side surface of the silicon substrate.

According to a third aspect of the present disclosure, a semiconductor device includes: a silicon substrate having a first conductive type; a first epitaxial film having the first conductive type on the silicon substrate, wherein the first epitaxial film has an impurity concentration lower than that of the silicon substrate; a plurality of trenches in the first epitaxial film; and a second epitaxial film having a second conductive type in each trench. The first epitaxial film between two adjacent trenches provides a first impurity region. The second epitaxial film in the trench provides a second impurity region. The first impurity region and the second impurity region are alternately arranged along with a predetermined direction parallel to the silicon substrate so that a super junction structure is provided. The silicon substrate has an arsenic concentration as the impurity concentration therein, which is defined as $\alpha$. The second epitaxial film has an impurity concentration, which is defined as $\beta$. The arsenic concentration in the silicon substrate and the impurity concentration in the second epitaxial film has a relationship of: $\alpha \leq 3 \times 10^{19} \times \ln(\beta) - 1 \times 10^{21}$.

The above device has an excellent carrier concentration distribution.

Alternatively, the trench may have a bottom, which does not reach the silicon substrate. Further, the device may further include a protection film disposed on one surface of the silicon substrate and on a side surface of the silicon substrate. The one surface of the silicon substrate is opposite to the first epitaxial film. Further, the semiconductor device may be a vertical type super junction MOS device.

According to a fourth aspect of the present disclosure, a method for evaluating a semiconductor device is provided. The device includes: a silicon substrate having a first conductive type; a first epitaxial film having the first conductive type on the silicon substrate, wherein the first epitaxial film has an impurity concentration lower than that of the silicon substrate; a plurality of trenches in the first epitaxial film; and a second epitaxial film having a second conductive type in each trench, wherein the first epitaxial film between two adjacent trenches provides a first impurity region, the second epitaxial film in the trench provides a second impurity region, and the first impurity region and the second impurity region are alternately arranged along with a predetermined direction parallel to the silicon substrate so that a super junction structure is provided. The method includes steps of: irradiating a primary ion on a surface of a predetermined region of the super junction structure so that the surface of the predetermine region is etched in a depth direction perpendicular to the silicon substrate, wherein the predetermined region of the super junction structure includes a plurality of first impurity regions and second impurity regions; mass-analyzing a secondary ion, which is discharged from the surface of the predetermine region; measuring an average concentration of a dopant in the first impurity regions along with the depth direction; measuring an average concentration of a dopant in the second impurity regions along with the depth direction; measuring an average concentration of a dopant in the silicon substrate along with the depth direction; and determining a carrier concentration distribution of the super junction structure on the basis of the average concentration in each of the first impurity regions, the second impurity regions and the silicon substrate.

In the above method, the carrier concentration distribution of the super junction structure is appropriately evaluated in view of influence of a shape, a crystal orientation, a depth profile and the like.

According to a fifth aspect of the present disclosure, a method for evaluating a semiconductor device is provided. The device includes: a silicon substrate having a first conductive type; a plurality of trenches in the silicon substrate; and an epitaxial film having a second conductive type in each trench, wherein the silicon substrate between two adjacent trenches provides a first impurity region, the epitaxial film in the trench provides a second impurity region, and the first impurity region and the second impurity region are alternately arranged along with a predetermined direction parallel to the silicon substrate so that a super junction structure is provided. The method includes steps of: irradiating a primary ion on a surface of a predetermined region of the super junction structure so that the surface of the predetermine region is etched in a depth direction perpendicular to the silicon substrate, wherein the predetermined region of the super junction structure includes a plurality of first impurity regions and second impurity regions; mass-analyzing a secondary ion, which is discharged from the surface of the predetermine region; measuring an average concentration of a dopant in the first impurity regions along with the depth direction; measuring an average concentration of a dopant in the second impurity regions along with the depth direction; and determining a carrier concentration distribution of the super junction structure on the basis of the average concentration in each of the first impurity regions and the second impurity regions.

In the above method, the carrier concentration distribution of the super junction structure is appropriately evaluated in view of influence of a shape, a crystal orientation, a depth profile and the like.

While the invention has been described with reference to preferred embodiments thereof, it is to be understood that the invention is not limited to the preferred embodiments and constructions. The invention is intended to cover various modification and equivalent arrangements. In addition, while the various combinations and configurations, which are preferred, other combinations and configurations, including more, less or only a single element, are also within the spirit and scope of the invention.

What is claimed is:

1. A method for manufacturing a semiconductor device comprising steps of:
    forming a first epitaxial film having a first conductive type on a silicon substrate having the first conductive type, wherein the first epitaxial film has an impurity concentration lower than that of the silicon substrate;
    forming a trench in the first epitaxial film; and
    forming a second epitaxial film having a second conductive type on the first epitaxial film and in the trench so that the trench is filled with the second epitaxial film, wherein
    the step of forming the second epitaxial film includes a final step, in which a mixed gas of a silicon source gas and a halide gas is used for forming the second epitaxial film,
    the silicon substrate has an arsenic concentration as the impurity concentration therein, which is defined as $\alpha$ cm$^{-3}$,
    the second epitaxial film has an impurity concentration, which is defined as $\beta$ cm$^{-3}$, and
    the arsenic concentration in the silicon substrate and the impurity concentration in the second epitaxial film has a relationship of:
    $$\alpha \leq 3 \times 10^{19} \times \ln(\beta) - 1 \times 10^{21}.$$

2. The method according to claim 1, wherein
    in the final step of the step of forming the second epitaxial film, a growth rate of the second epitaxial film near an opening of the trench is smaller than a growth rate of the second epitaxial film in the trench.

3. The method according to claim 1, wherein
    in the step of forming the second epitaxial film, a halide gas is used for forming the second epitaxial film,
    the halide gas has a standard flow rate, which is defined as X in slm unit,
    the second epitaxial film is grown with a growth rate, which is defined as Y in unit of micron per minute,
    the trench has an aspect ratio smaller than 10, and
    the standard flow rate of the halide gas and the growth rate of the second epitaxial film has a relationship of:
    $$Y < 0.2X + 0.1.$$

4. The method according to claim 1, wherein
    in the step of forming the second epitaxial film, a halide gas is used for forming the second epitaxial film,
    the halide gas has a standard flow rate, which is defined as X in slm unit,
    the second epitaxial film is grown with a growth rate, which is defined as Y in unit of micron per minute,
    the trench has an aspect ratio equal to or larger than 10 and smaller than 20, and
    the standard flow rate of the halide gas and the growth rate of the second epitaxial film has a relationship of:
    $$Y < 0.2X + 0.05.$$

5. The method according to claim 1, wherein
    in the step of forming the second epitaxial film, a halide gas is used for forming the second epitaxial film,
    the halide gas has a standard flow rate, which is defined as X in slm unit,
    the second epitaxial film is grown with a growth rate, which is defined as Y in unit of micron per minute,
    the trench has an aspect ratio equal to or larger than 20, and
    the standard flow rate of the halide gas and the growth rate of the second epitaxial film has a relationship of:
    $$Y < 0.2X.$$

6. The method according to claim 1, wherein
    in the step of forming the trench, the trench does not reach the silicon substrate.

7. The method according to claim 1, further comprising a step of:
    forming a protection film on one surface of the silicon substrate and on a side surface of the silicon substrate before the step of forming the second epitaxial film, wherein
    the one surface of the silicon substrate is opposite to the first epitaxial film.

* * * * *